(12) United States Patent
Kato et al.

(10) Patent No.: US 8,773,207 B2
(45) Date of Patent: Jul. 8, 2014

(54) PHASE LOCKED LOOP, SEMICONDUCTOR DEVICE, AND WIRELESS TAG

(75) Inventors: Kiyoshi Kato, Atsugi (JP); Takanori Matsuzaki, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 97 days.

(21) Appl. No.: 13/173,595

(22) Filed: Jun. 30, 2011

(65) Prior Publication Data
US 2011/0254600 A1    Oct. 20, 2011

Related U.S. Application Data

(63) Continuation of application No. 11/979,995, filed on Nov. 13, 2007, now Pat. No. 7,973,608.

(30) Foreign Application Priority Data

Nov. 30, 2006   (JP) ................................. 2006-323119

(51) Int. Cl.
*H03L 7/00*    (2006.01)
(52) U.S. Cl.
USPC ............................... 331/17; 331/1 A; 331/25
(58) Field of Classification Search
USPC ............... 331/1 A, 16, 17; 327/156; 340/10.1
See application file for complete search history.

(56) References Cited

U.S. PATENT DOCUMENTS

| | | | |
|---|---|---|---|
| 4,731,870 A * | 3/1988 | Black et al. ................ | 455/127.5 |
| 5,302,920 A | 4/1994 | Bitting | |
| 5,485,154 A | 1/1996 | Brooks et al. | |
| 5,686,714 A | 11/1997 | Abe et al. | |
| 5,942,949 A | 8/1999 | Wilson et al. | |
| 5,949,047 A | 9/1999 | Abe et al. | |
| 6,188,285 B1 | 2/2001 | Nakanishi et al. | |
| 6,229,399 B1 * | 5/2001 | Tobise et al. .................... | 331/17 |

(Continued)

FOREIGN PATENT DOCUMENTS

| | | |
|---|---|---|
| CN | 1202042 | 12/1998 |
| CN | 1691513 | 11/2005 |
| EP | 0702315 A | 3/1996 |
| EP | 0 874 463 A3 | 12/2000 |
| JP | 02-141127 A | 5/1990 |
| JP | 08-077317 A | 3/1996 |
| JP | 09-061517 A | 3/1997 |
| JP | 10-065525 | 3/1998 |
| JP | 11-045314 A | 2/1999 |
| JP | 11-168405 A | 6/1999 |
| JP | 2003-087116 A | 3/2003 |
| JP | 2003-178272 A | 6/2003 |
| JP | 2004-260411 A | 9/2004 |
| JP | 2004-266594 A | 9/2004 |
| WO | WO 2006/028258 | 3/2006 |
| WO | WO 2006/118284 | 11/2006 |

OTHER PUBLICATIONS

Korean Office Action (Application No. 2014-0015082) Dated Apr. 18, 2014.

*Primary Examiner* — Joseph Chang
*Assistant Examiner* — Jeffrey Shin
(74) *Attorney, Agent, or Firm* — Eric J. Robinson; Robinson Intellectual Property Law Office, P.C.

(57) ABSTRACT

An object is to provide a PLL having a wide operating range. Another object is to provide a semiconductor device or a wireless tag which has a wide operating range in a communication distance or temperature by incorporating such a PLL. The semiconductor device or the wireless tag includes a first divider circuit; a second divider circuit; a phase comparator circuit to which an output of the first divider circuit and an output of the second divider circuit are provided; a loop filter to which an output of the phase comparator circuit is supplied and in which a time constant is switched in accordance with an inputted signal; and a voltage controlled oscillator circuit to which an output of the loop filter is supplied and which supplies an output to the second divider circuit.

16 Claims, 15 Drawing Sheets

(56) References Cited

U.S. PATENT DOCUMENTS

| | | |
|---|---|---|
| 6,615,074 B2 | 9/2003 | Mickle et al. |
| 6,727,763 B2 | 4/2004 | Endo |
| 7,148,764 B2 | 12/2006 | Kasahara et al. |
| 7,248,165 B2 | 7/2007 | Collins et al. |
| 7,301,414 B2 | 11/2007 | Hino |
| 7,349,672 B2 | 3/2008 | Noda et al. |
| 7,406,297 B2 | 7/2008 | Osada |
| 2005/0052283 A1* | 3/2005 | Collins et al. ............. 340/572.7 |
| 2006/0281435 A1* | 12/2006 | Shearer et al. ............ 455/343.1 |
| 2008/0054638 A1* | 3/2008 | Greene et al. ................ 290/1 R |

* cited by examiner

PHASE LOCKED LOOP, SEMICONDUCTOR DEVICE, AND WIRELESS TAG

BACKGROUND OF THE INVENTION

1. Field of the Invention

The present invention relates to a phase locked loop. In addition, the present invention relates to a semiconductor device including the phase locked loop. Furthermore, the present invention relates to a wireless tag including the semiconductor device and an antenna.

2. Description of the Related Art

A phase locked loop (PLL) has a function to generate a clock signal which is synchronized with an inputted clock signal or a clock signal which has N times higher frequency than that of an inputted clock signal. Alternatively, the phase locked loop has a function to generate a stable clock signal when a data signal which is similar to a clock signal is inputted.

In the following Reference 1 (Japanese Published Patent Application No. H10-065525 (FIG. 5 in Page 3)), a basic structure of a phase locked loop is described.

SUMMARY OF THE INVENTION

For example, a PLL is used in wireless communication. When a PLL is incorporated in a wireless tag, the PLL can generate a stable clock signal by using transmitted data from a reader/writer as an input signal. Based on the clock signal, the wireless tag can perform operation such as data reception.

FIG. 10 shows an example of a block structure of a wireless tag incorporating a PLL. In FIG. 10, the wireless tag includes a semiconductor device 1001 and an antenna 1000. The semiconductor device 1001 includes a power supply circuit 1002, a demodulation circuit 1003, a modulation circuit 1004, a PLL 1005, and a logic circuit 1006. A demodulated signal that is an output of the demodulation circuit 1003 is inputted to the PLL 1005, and the PLL 1005 outputs a clock signal CLK. The logic circuit 1006 operates in synchronization with the clock signal CLK.

As the PLL, for example, a structure shown in FIG. 9 can be thought. In FIG. 9, a PLL 901 includes a phase comparator circuit (also referred to as a phase detector (PD)) 902, a loop filter (LPF) 903, a voltage controlled oscillator circuit (VCO) 904, and a divider circuit (DIV) 905; a signal In is inputted to the PLL 901 and an output signal Out is outputted from the PLL 901. Since the case where a frequency that is higher than a frequency of a demodulated signal is used inside the logic is supposed, a structure using the divider circuit 905 is shown in FIG. 9. Other than a data reception period, an input signal to the PLL becomes constant, and an output signal Out which is outputted by the PLL has a frequency at the time of free-running oscillation (hereinafter, a free-running oscillation frequency). Therefore, transmission of data from the wireless tag is performed in synchronization with the free-running oscillation frequency of the PLL.

When the operation experiment of the wireless tag incorporating the PLL 901 shown in FIG. 9 is conducted, data reception is performed without problems; however, it is confirmed that the change in transmission speed in data reception is large and there is a defect that communication is incapable of being performed. When a time constant of the loop filter is increased as a countermeasure, a defect at the time of data transmission is improved; however, a yield of data reception operation decreases.

Such a behavior is described as follows. It is important for the PLL which is incorporated in the wireless tag to be locked in a predetermined time and to have a wide lock range with respect to the change of a power source at the time of data reception. For example, it is preferable to relatively shorten a time constant of the loop filter. In addition, at the time of data transmission, it is necessary that the change of the free-running oscillation frequency lie within the range of communication standards. In this case, it is preferable to increase the time constant of the loop filter. That is, the experiment shows that, although the wireless tag can be stably operated when both the lock range and a change in the free-running oscillation frequency are improved, the wireless tag is incapable of being stably operated because it is difficult to improve both the lock range and a change in the free-running oscillation frequency in the PLL shown in FIG. 9. Note that one of reasons why it is difficult to stably operate the wireless tag is that a power source is changed at the time of data reception. For example, by a 100% AM modulation system, since a period in which power supply stops due to modulation is generated, the change of a power supply voltage is generated. In particular, the change of the power supply voltage becomes remarkable in a passive matrix wireless tag.

In view of the above-described circumstances, the present invention is made. An object of the present invention is to provide a PLL having a wide operating range. Another object of the present invention is to provide a semiconductor device or a wireless tag each of which has a wide operating range in a communication distance or temperature by incorporating such a PLL.

The inventors have focused attention on characteristics needed for the PLL which vary according to the operating condition of a semiconductor device. Then, they have thought of a method for switching the structure of the PLL in accordance with the operation of the semiconductor device, by using a feature that data transmission and data reception are not performed at the same time, a period is clearly separated, and the characteristics needed for the PLL vary in each period in normal wireless communication. In this way, the operating range of the semiconductor device and the wireless tag can be improved. Note that the operating range of the wireless tag refers to the range that the wireless tag operates with respect to conditions such as a communication distance or temperature. In addition, the operating range of the semiconductor device refers to the range that the semiconductor device operates with respect to parameters such as a power supply voltage or temperature which are the operating conditions of the semiconductor device.

Specifically, in order to switch characteristics of the PLL, it is effective to switch a time constant of a loop filter or to switch a frequency division number of a divider circuit. In addition, it is also effective to switch back and forth between a structure in which an output of the loop filter is inputted to a VCO (voltage controlled oscillator) and a structure in which the output (reference voltage) of a bias circuit is inputted to the VCO.

The above-described method for switching the characteristics of the PLL can be applied to the case where the free-running oscillation frequency in a plurality of periods is desired to be controlled.

For example, since power consumption varies during a period in which writing is performed to a memory and during a period in which writing is not performed, there is the case where a power supply voltage slightly varies. On the other hand, during a period in which a wireless tag transmits data, it is necessary to keep the free-running oscillation frequency of the PLL constant. In such a case, by switching a load of the VCO in accordance with a period or by shifting a potential of an input signal of the VCO, the free-running oscillation frequency can be controlled and the operating range of the wireless tag can be improved.

As described above, the present invention realizes a PLL of which operating range is improved and a semiconductor device having the PLL of which operating range is improved. Accordingly, an excellent semiconductor device or excellent wireless tag which has a wide communication range and operates normally even in a harsh environment at low or high temperature can be realized.

DETAILED DESCRIPTION OF THE INVENTION

Hereinafter, embodiment modes and embodiments of the present invention will be described with reference to the accompanying drawings. However, the present invention can be implemented in various modes. As can be easily understood by a person skilled in the art, the modes and details of the present invention can be changed in various ways without departing from the spirit and scope of the present invention. Thus, the present invention should not be interpreted as being limited to the following description of the embodiment modes and embodiments.

Embodiment Mode 1

Figure 1:
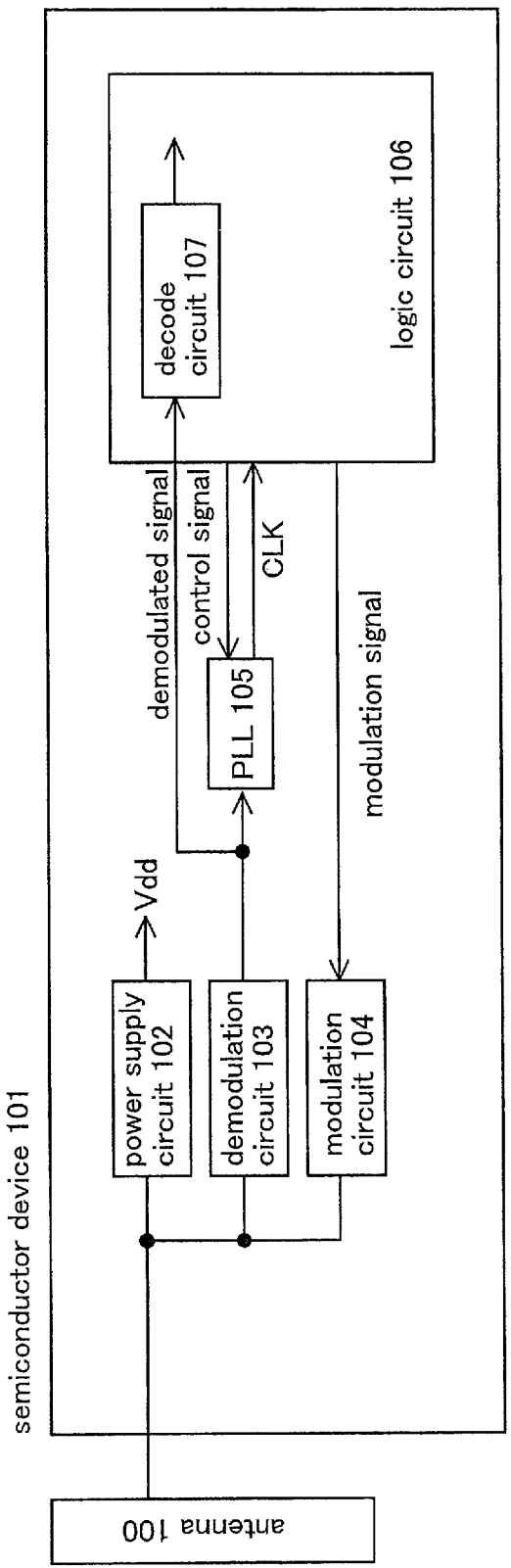
FIG. 1 is a block diagram showing a structure of a semiconductor device of the present invention.

FIG. 1 shows an example of a block structure of a semiconductor device of the present invention.

In FIG. 1, a semiconductor device 101 forms a wireless tag by being connected to an antenna 100. The semiconductor device 101 includes a power supply circuit 102, a demodulation circuit 103, a modulation circuit 104, a PLL 105, and a logic circuit 106. The power supply circuit 102 rectifies an alternating current signal inputted from the antenna 100 and generates a predetermined power supply voltage Vdd. The demodulation circuit 103 extracts information from the alternating current signal inputted from the antenna 100 and outputs a demodulated signal. For example, in the case of amplitude modulation (ASK), a demodulated signal is generated by rectification and filtering. A modulation signal is inputted to the modulation circuit 104, and the impedance of the semiconductor device 101 is changed by load modulation or the like. Accordingly, the wireless tag transmits a response signal.

A clock signal CLK and a demodulated signal are inputted to the logic circuit 106, and the logic circuit 106 outputs a modulation signal. The demodulated signal is inputted to a decode circuit 107 included in the logic circuit, and the decode circuit 107 converts (decodes) a received signal into "0" or "1" and generates a data signal, or the decode circuit 107 recognizes an SOF (start of frame) and an EOF (end of frame) and generates various control signals. The logic circuit includes a command analysis portion, a check circuit (which checks integrity of received data), a memory, a memory control circuit, an output circuit (which generates a modulation signal), or the like, as well as the decode circuit, and performs processing in accordance with a received command.

A demodulated signal which is the output of the demodulation circuit 103 and a control signal are inputted to the PLL 105, and the PLL 105 outputs a clock signal CLK to serve as a reference of the logic circuit. The control signal is a signal which is generated by the decode circuit 107 or another portion of the logic circuit 106 and controls the switching of the PLL.

Figure 2:
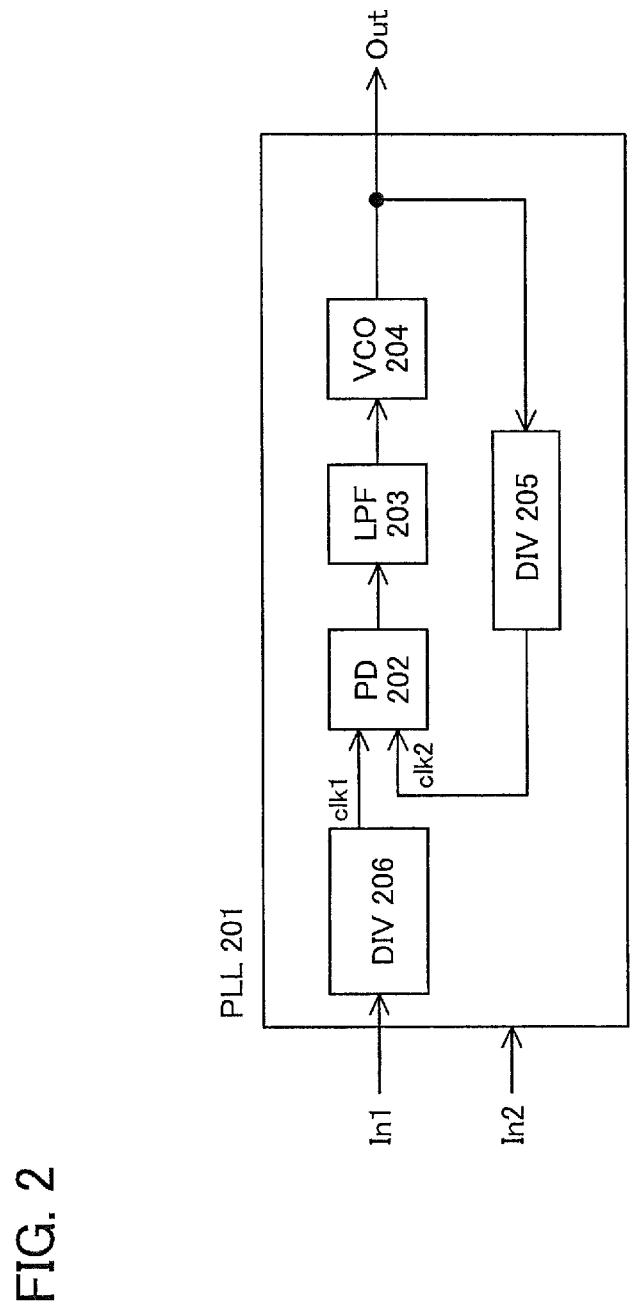
FIG. 2 is a block diagram of a PLL included in a semiconductor device of the present invention.

FIG. 2 shows an example of a block structure of a PLL included in a semiconductor device of the present invention.

In FIG. 2, a PLL 201 includes a divider circuit (DIV) 206, a divider circuit (DIV) 205, a phase comparator circuit (also referred to as a phase detector (PD)) 202, a loop filter (LPF) 203, and a voltage control oscillation circuit (VCO) 204. An input signal In1 and an input signal In2 are inputted to the PLL 201, and the PLL 201 outputs an output signal Out. The input signal In1, the input signal In2, and the output signal Out correspond to the demodulated signal, the control signal, and the clock signal CLK in the wireless tag shown in FIG. 1, respectively.

A signal clk1 and a signal clk2 are inputted to the phase comparator circuit 202, and the phase comparator circuit 202 performs phase comparison. As the phase comparator circuit 202, a known circuit such as an analog phase comparator circuit such as a double balanced mixer, or a digital phase comparator circuit using an exclusive OR gate or an RS flip-flop can be used.

The LPF 203 is a low-pass filter and averages an output of the phase comparator circuit. The LPF 203 can be selected as appropriate from a rag filter, a lag-lead filter, an active loop filter, and the like within the range that the PLL 201 operates stably.

An output signal of the LPF 203 is inputted to the VCO 204; the VCO 204 determines an oscillation frequency based on the output signal and outputs the output signal Out. As the VCO 204, a known circuit such as a circuit having a structure using a ring oscillator, a CR oscillator circuit, an LC oscillator circuit, or a circuit having a structure using a crystal oscillator or the like can be used. The output signal Out is inputted to the divider circuit 205 (which is a divide-by-N frequency divider), and the divider circuit 205 generates a signal clk2 having a frequency of 1/N. The input signal In1 is inputted to the divider circuit 206 (which is a divide-by-M frequency divider), and the divider circuit 206 generates a signal clk1 having a frequency of 1/M. As described above, the PLL forms a feedback circuit and generates the output signal Out in synchronization with the input signal In1.

The divider circuit 205 has a role to set the output signal Out to have a frequency which is N times larger than that of the signal clk1. The divider circuit 205 is effective in the case where an internal clock of the semiconductor device is desired to be set earlier than the signal clk1. The divider circuits 205 and 206 are not necessarily used.

As important characteristics of the PLL in the wireless tag shown in FIG. 1, changes in the lock range and the free-running oscillation frequency are given. In the wireless tag, since a timing of the input signal In1 is determined by the communication standards, the lock range can be thought as a range of Vdd which can generate a signal in synchronization with a predetermined signal clk1. When Vdd is not within the lock range, the wireless tag is incapable of decoding received data correctly and does not operate. The lock range relates to the decoding operation of the wireless tag, and can be said as important characteristics for the PLL during a period in which the wireless tag receives data.

The change of the free-running oscillation frequency can be thought as a frequency change of the output signal Out in the case where the wireless tag does not receive data and the input signal In1 has a constant value. When the change of the free-running oscillation frequency is large, a frequency change of a response signal of the wireless tag is large; in the case where the change of the free-running oscillation frequency is not within the communication standards, there is a possibility that wireless communication is incapable of being performed. The free-running oscillation frequency relates to the reply operation of the wireless tag and can be said as important characteristics during a period in which the wireless tag transmits data.

The changes in the lock range and the free-running oscillation frequency depend on a time constant of the filter of the PLL, a frequency division number of the divider circuit, characteristics of the VCO, or the like.

In general, the wireless tag does not perform data reception and data transmission at the same time, and a period of receiving data and a period of transmitting data are separated. The wireless tag shown in FIG. 1 can improve the operating range of the wireless tag by switching the structure of the PLL with a control signal in a data reception period and a data transmission period. For example, when the input signal In2 has a value of "0" or "1", the input signal In2 is set to have a value of "0" during a period in which the wireless tag receives data, and the input signal In2 is set to have a value of "1" during a period in which the wireless tag transmits data. By switching back and forth between a structure having a wide lock range in the case where the value of the input signal In2 is "0" and a structure having a small change of the free-running oscillation frequency in the case where the value of the input signal In2 is "1" with each other, a PLL having performance suited for each period can be realized. Accordingly, the wireless tag of which the operating range is wide in a communication range and temperature, that is, an excellent wireless tag which operates normally with respect to a longer distance or environment such as environment at lower temperature or at higher temperature can be realized.

Note that the example is shown in which the data reception period and the data transmission period are separated from each other; however, the present invention is not limited to this. The present invention can be applied to the case where a period in which the wireless tag operates is divided into a plurality of periods and characteristics needed for the PLL vary in each period. The logic circuit included in the semiconductor device generates a control signal for identifying a plurality of periods, and the PLL switches a structure suited for each period, based on the control signal. By using such a structure, the PLL and the semiconductor device of the present invention can realize a wide operating range. Needless to say, the number of control signals is not necessarily just one, and a plurality of control signals can be provided.

Note that, in FIG. 1, the antenna 100 is attached to the semiconductor device 101 externally; however, the semiconductor device 101 may incorporate the antenna 100. In addition, a communication method may be either an electric wave method or an electromagnetic induction method.

Embodiment Mode 2

Figure 3:
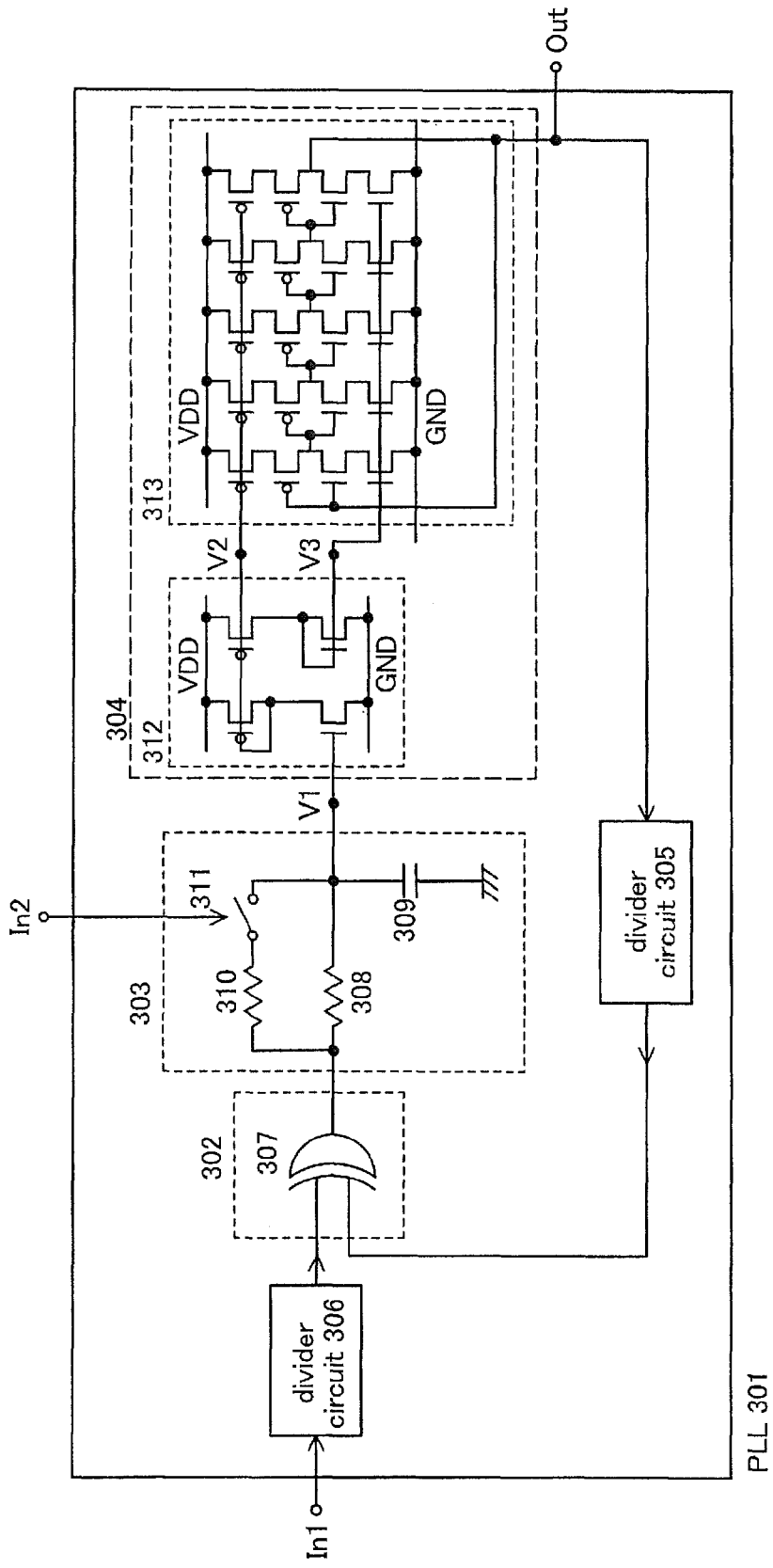
FIG. 3 is a circuit diagram of a PLL included in a semiconductor device of the present invention.

FIG. 3 shows an example of a circuit structure of a PLL included in a semiconductor device of the present invention. In FIG. 3, a PLL 301 includes a divider circuit 306, a divider circuit 305, a phase comparator circuit 302, a loop filter (LPF) 303, and a voltage control oscillation circuit (VCO) 304. An input signal In1 and an input signal In2 are inputted to the PLL 301, and the PLL 301 outputs an output signal Out.

Figure 11:
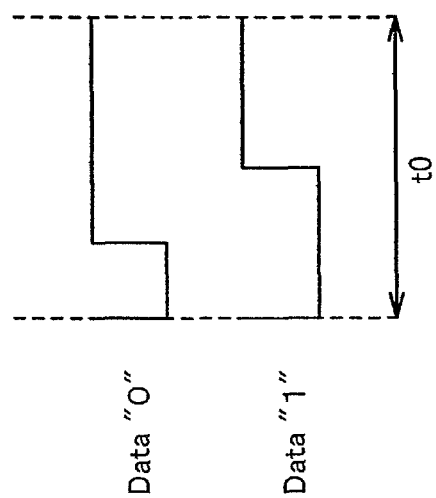
FIG. 11 is a diagram showing a bit width of a demodulated signal.

The phase comparator circuit 302 includes an exclusive OR gate (XOR) 307, and outputs exclusive OR of a signal clk1 and a signal clk2. The LPF 303 includes a resistor 308 (resistance value R1), a resistor 310 (resistance value R2), a capacitor 309 (capacitance value C1), and a switch 311. The LPF 303 is a low-pass filter when a resistance value is R1, a capacitance value is C1, and a time constant is R1×C1 in the case where the switch 311 is in an off state. In the case where the switch 311 is in an on state, a resistance value is R3=(1/(1/R1+1/R2)), a capacitance value is C1, and a time constant is R3×C1. Since R3<R1 is satisfied, the switch 311 has a smaller time constant in an on state than that in an off state. A potential V1 is inputted to the VCO 304, and the VCO 304 includes a reference circuit 312 which generates a potential V2 and a potential V3 and an oscillator circuit 313 which controls a frequency with the potential V2 and the potential V3. The reference circuit 312 includes two N-channel transistors and two P-channel transistors. The oscillator circuit 313 has a five-stage structure, and each stage includes two N-channel transistors and two P-channel transistors. The divider circuit 306 is a divide-by-2 frequency divider. For example, as shown in FIG. 11, in the case where a demodulated signal in which data "0" and data "1" are expressed by the same bit width (t0) is inputted as the input signal In1, when the divider circuit 306 is set to be a divide-by-2 frequency divider, the divider circuit 306 can generate a signal having a constant frequency, which is preferable. The divider circuit 305 is set so that a reference clock signal which is an output of the PLL is 64 times larger than the signal clk1.

The PLL shown in FIG. 3 has a structure in which a resistance value of the low-pass filter is switched with the input signal In2. With this switching, a time constant of the filter is changed, and characteristics of the PLL vary.

For example, by forming a structure in which the switch 311 is in an on state in the data reception period and the switch 311 is in an off state in the data transmission period, the operating range of a wireless tag can be improved. This is described as follows.

In the data reception period, the lock range of the PLL is preferably wide so that decoding operation is performed correctly. The lock range of the PLL is wider when a time constant of the LPF 303 is small. This is because a good transient characteristic of the PLL is obtained and the PLL responds promptly with respect to a change of the power supply voltage when a time constant is small. On the other hand, in the case where a time constant is large, the PLL can not respond to the change of the power supply voltage. Thus, a lock easily comes off, because the frequency of the PLL fits the predetermined frequency slowly because it is difficult to change the frequency of the PLL, therefore, the lock range is narrowed. Needless to say, when a time constant is too small, all signals pass through the filter; therefore, the filter does not function. For example, when a period of the signal clk1 is set as T1, a time constant is preferably (½×T1) to (2×T1).

In the data transmission period, it is preferable that a change of the free-running oscillation frequency of the PLL be small so that reply operation is performed correctly. Since a receiving electric wave is not modulated in the data transmission period, it can be thought that a change in Vdd is small and the speed of feedback of the PLL has an effect on the change of the free-running oscillation frequency. In this case, in order to suppress the change of the free-running oscillation frequency, it is preferable that a time constant of the LPF 303 be large. This is because an output signal of the LPF 303 is further averaged and a value is close to being constant when a time constant is large. For example, when a period of the signal clk2 is set as T2, a time constant is preferably (2×T2) to (100×T2).

Therefore, for example, when the input signal In2 has a value of "0" or "1", the input signal In2 is set to have a value of "1" during a period in which the wireless tag receives data, and the input signal In2 is set to have a value of "0" during a period in which the wireless tag transmits data. The switch 311 is turned on when the value of the input signal In2 is "1", and the switch 311 is turned off when the value of the input signal In2 is "0". Accordingly, during the period in which the wireless tag receives data, the switch 311 is turned on, a time constant of the LPF 303 decreases, and a structure having a wide lock range is realized. In addition, during the period in which the wireless tag transmits data, the switch 311 is turned off, a time constant of the LPF 303 increases, and a structure having a small change of the free-running oscillation frequency is realized. In this way, the PLL of the present invention shown in FIG. 3 and a semiconductor device which incorporates the PLL can realize a wide operating range.

By using such a PLL, in a plurality of periods such as the data reception period and the data transmission period, a PLL can be formed so as to be suited for each period, and a semiconductor device having a wide operating range can be realized. Note that the number of control signals is not necessarily just one, and control can be performed with a plurality of control signals.

Embodiment 1

Figure 4:
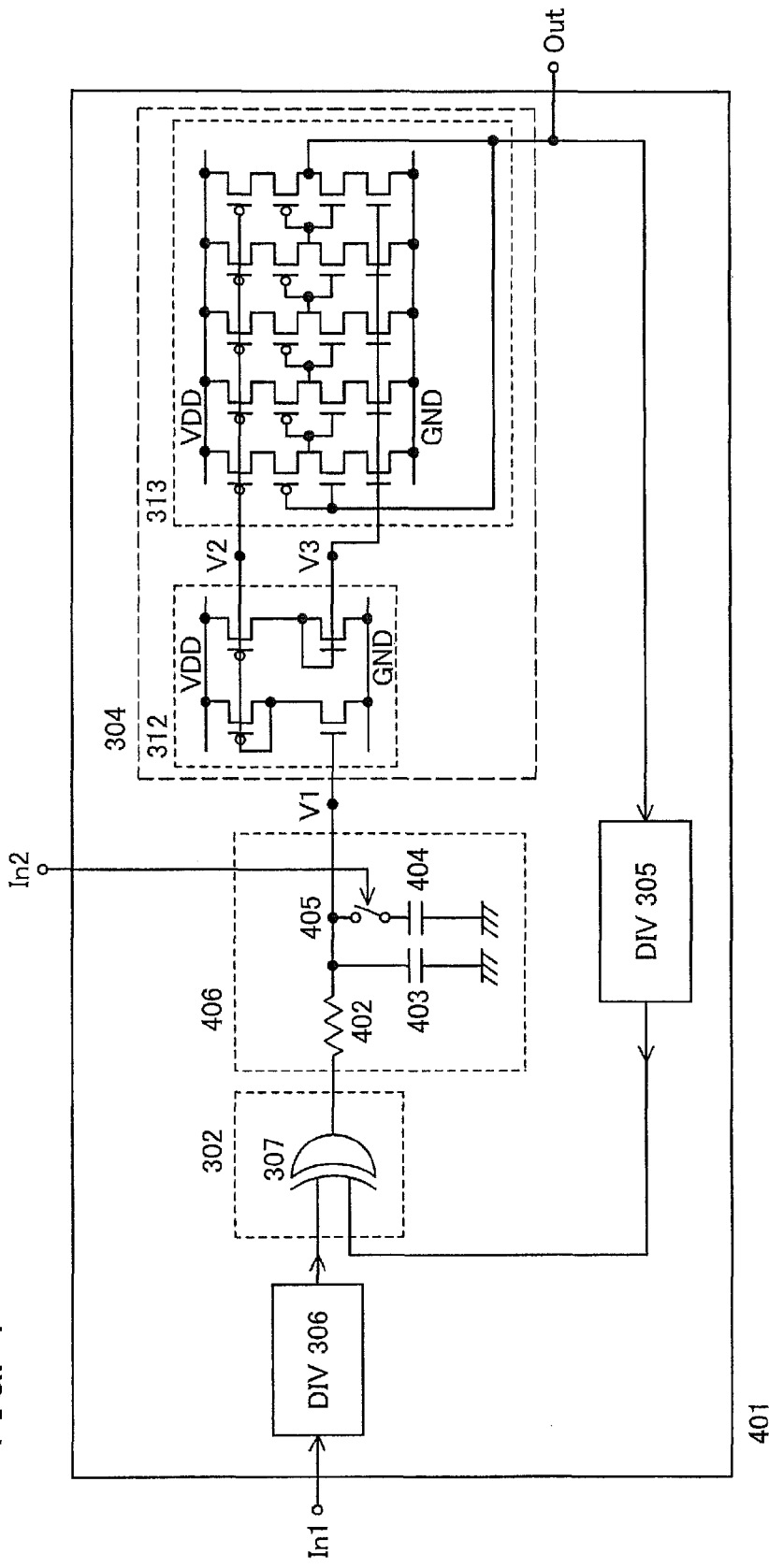
FIG. 4 is a circuit diagram of a PLL included in a semiconductor device of the present invention.

FIG. 4 shows an example which is different from the embodiment modes as a circuit structure of a PLL included in a semiconductor device of the present invention.

In FIG. 4, a PLL 401 includes the divider circuit (DIV) 306, the divider circuit (DIV) 305, the phase comparator circuit (also referred to as a phase detector (PD)) 302, a loop filter (LPF) 406, and the voltage control oscillation circuit (VCO) 304. An input signal In1 and an input signal In2 are inputted to the PLL 401, and the PLL 401 outputs an output signal Out.

The phase comparator circuit 302 includes the exclusive OR gate (XOR) 307, and outputs exclusive OR of a signal clk1 and a signal clk2. The LPF 406 includes a resistor 402 (resistance value R1), a capacitor 403 (capacitance value C1), a capacitor 404 (capacitance value C2), and a switch 405. The LPF 406 is a low-pass filter when a resistance value is R1, a capacitance value is C1, and a time constant is R1×C1 in the case where the switch 405 is in an off state. In the case where the switch 405 is in an on state, a resistance value is R1, a capacitance value is C1+C2, and a time constant is R1×(C1+C2). Therefore, the switch 405 has a larger time constant in an on state than that in an off state. The potential V1 is inputted to the VCO 304, and the VCO 304 includes the reference circuit 312 which generates the potential V2 and the potential V3 and the oscillator circuit 313 which controls a frequency with the potential V2 and the potential V3. The reference circuit 312 includes two N-channel transistors and two P-channel transistors. The oscillator circuit 313 has a five-stage structure, and each stage includes two N-channel transistors and two P-channel transistors. The divider circuit 306 is a divide-by-2 frequency divider. For example, as shown in FIG. 11, in the case where a demodulated signal in which data "0" and data "1" are expressed by the same bit width (t0) is inputted as the input signal In1, when the divider circuit 306 is set to be a divide-by-2 frequency divider, the divider circuit 306 can generate a signal having a constant frequency, which is preferable. The divider circuit 305 is set so that a reference clock signal which is an output of the PLL is 64 times larger than the signal clk1.

The PLL shown in FIG. 4 has a structure in which a capacitance value of the low-pass filter is switched with the input signal In2. With this switching, a time constant of the filter is changed, and characteristics of the PLL vary.

For example, by forming a structure in which the switch 405 is in an off state in a data reception period and the switch 405 is in an on state in a data transmission period, the operating range of a wireless tag can be improved. This is described as follows.

In the data reception period, the lock range of the PLL is preferably wide so that decoding operation is performed correctly. The lock range of the PLL is wider when a time constant of the LPF 406 is small. This is because a good transient characteristic of the PLL is obtained and the PLL responds promptly with respect to a change of the power supply voltage when a time constant is small. On the other hand, in the case where a time constant is large, the PLL can not respond to the change of the power supply voltage. Thus, a lock easily comes off, because the frequency of the PLL fits the predetermined frequency slowly because it is difficult to change the frequency of the PLL, therefore, the lock range is narrowed. Needless to say, when a time constant is too small, all signals pass through the filter; therefore, the filter does not function. For example, a time constant is preferably (½×T1) to (2×T1) when a period of the signal clk1 is set as T1.

In the data transmission period, it is preferable that a change of the free-running oscillation frequency of the PLL be small so that reply operation is performed correctly. Since a receiving electric wave is not modulated in the data transmission period, it can be thought that a change in Vdd is small and the speed of feedback of the PLL has an effect on the change of the free-running oscillation frequency. In this case, in order to suppress the change of the free-running oscillation frequency, it is preferable that a time constant of the LPF 406 be large. This is because an output signal of the LPF 406 is further averaged and a value is close to being constant when a time constant is large. For example, when a period of the signal clk2 is set as T2, a time constant is preferably (2×T2) to (100×T2).

Therefore, for example, when the input signal In2 has a value of "0" or "1", the input signal In2 is set to have a value of "1" during a period in which the wireless tag receives data, and the input signal In2 is set to have a value of "0" during a period in which the wireless tag transmits data. The switch 405 is turned off when the value of the input signal In2 is "1", and the switch 405 is turned on when the value of the input signal In2 is "0". Accordingly, during the period in which the wireless tag receives data, the switch 405 is turned off, a time constant of the LPF 406 decreases, and a structure having a wide lock range is realized. In addition, during the period in which the wireless tag transmits data, the switch 405 is turned on, a time constant of the LPF 406 increases, and a structure having a small change of the free-running oscillation frequency is realized. In this way, the PLL of the present invention shown in FIG. 4 and a semiconductor device which incorporates the PLL can realize a wide operating range.

By using such a PLL, in a plurality of periods such as the data reception period and the data transmission period, a PLL can be formed so as to be suited for each period, and a semiconductor device having a wide operating range can be realized.

Note that the structure of the semiconductor device described in this embodiment can be combined with a structure of semiconductor devices described in other embodiment modes and embodiments in this specification.

Embodiment 2

Figure 5:
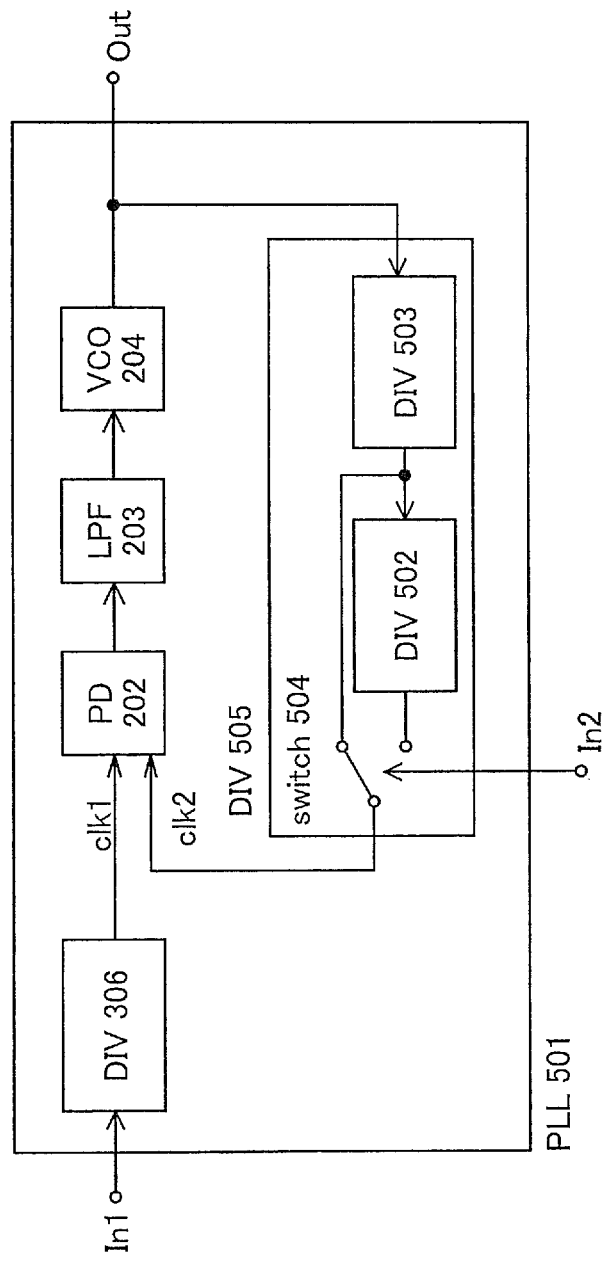
FIG. 5 is a block diagram of a PLL included in a semiconductor device of the present invention.

FIG. 5 shows an example of a circuit structure of a PLL included in a semiconductor device of the present invention.

In FIG. 5, a PLL 501 includes the divider circuit (DIV) 306, a divider circuit (DIV) 505, the phase comparator circuit (also referred to as a phase detector (PD)) 202, the loop filter (LPF) 203, and the voltage control oscillation circuit (VCO) 204. An input signal In1 and an input signal In2 are inputted to the PLL 501, and the PLL 501 outputs an output signal Out.

A signal clk1 and a signal clk2 are inputted to the phase comparator circuit 202, and the phase comparator circuit 202 performs phase comparison. The LPF 203 is a low-pass filter and averages an output of the phase comparator circuit. The output signal of the LPF 203, which is an averaged phase comparison result, is inputted to the VCO 204, and the VCO 204 determines an oscillation frequency based on the output signal and generates the output signal Out.

The input signal In1 is inputted to the divider circuit 306, and the divider circuit 306 generates a signal clk1 having ½ frequency. The divider circuit 505 includes a divider circuit 502, a divider circuit 503, and a switch 504. An output signal of the VCO 204 is inputted to the divider circuit 505, and the divider circuit 505 generates a signal clk2 having ⅛ frequency or 1/64 frequency. The frequency of the signal clk2 is switched back and forth between ⅛ frequency and 1/64 frequency with the input signal In2.

The PLL 501 shown in FIG. 5 has a structure in which the divider circuit 505 is switched with the input signal In2. Specifically, the PLL 501 switches back and forth between whether the frequency of the output signal Out of the VCO 204 is divided by 64 or by 8 and outputs the result as the signal clk2. As a result, characteristics of the PLL 501 change without changing the ratio of the frequencies of the input signal In1 and the output signal Out.

For example, an oscillation frequency of the VCO 204 at the time of free-running is 64 times larger than that of the signal clk1, the signal clk2 is 1/64 of the output signal of the VCO 204 in a data reception period, and the signal clk2 is ⅛ of the output signal of the VCO 204 in a data transmission period; accordingly, the operating range of a wireless tag can be improved. This is described as follows.

In the data reception period, a structure is provided in which a frequency of the signal clk1 and a frequency of the signal clk2 correspond with each other so that decoding operation is performed correctly. That is, the divider circuit 505 is a divide-by-64 frequency divider. When the divider circuit 505 is a divide-by-8 frequency divider, a frequency of the signal clk2 is 8 times larger than that of the signal clk1, so that a structure is formed which is incapable of being locked or in which a lock range is small.

In the data transmission period, since a receiving electric wave is not modulated, the input signal In1 is not necessarily locked, and it is preferable that a change of the free-running oscillation frequency be small so that reply operation is performed correctly. In order to suppress the change of the free-running oscillation frequency, it is preferable that feedback of the PLL be performed fast, that is, it is preferable that a frequency of the signal clk2 which performs phase comparison be increased. Depending on to what extent the change of the free-running oscillation frequency needs to be suppressed, the frequency of the signal clk2 in the data transmission period is preferably 2 to 128 times larger than the frequency of the signal clk2 in the data reception period. The PLL shown in FIG. 5 can reduce the change of the free-running oscillation frequency when the divider circuit 505 is a divide-by-8 frequency divider.

As a result, in particular, during the period in which the wireless tag transmits data, a structure having a small change of the free-running oscillation frequency is realized. In this way, the PLL of the present invention shown in FIG. 5 and a semiconductor device which incorporates the PLL can realize a wide operating range.

By using such a PLL, in a plurality of periods such as the data reception period and the data transmission period, a PLL can be formed so as to be suited for each period, and a semiconductor device having a wide operating range can be realized.

Note that the present invention is not limited to the structure shown in FIG. 5. Any structure may be used as long as the PLL which can change an oscillation frequency of the VCO without changing the ratio of the frequencies of the input signal In1 and the output signal Out is used. Note that the structure of the semiconductor device described in this embodiment can be combined with a structure of semiconductor devices described in other embodiment modes and embodiments in this specification.

Embodiment 3

Figure 12:
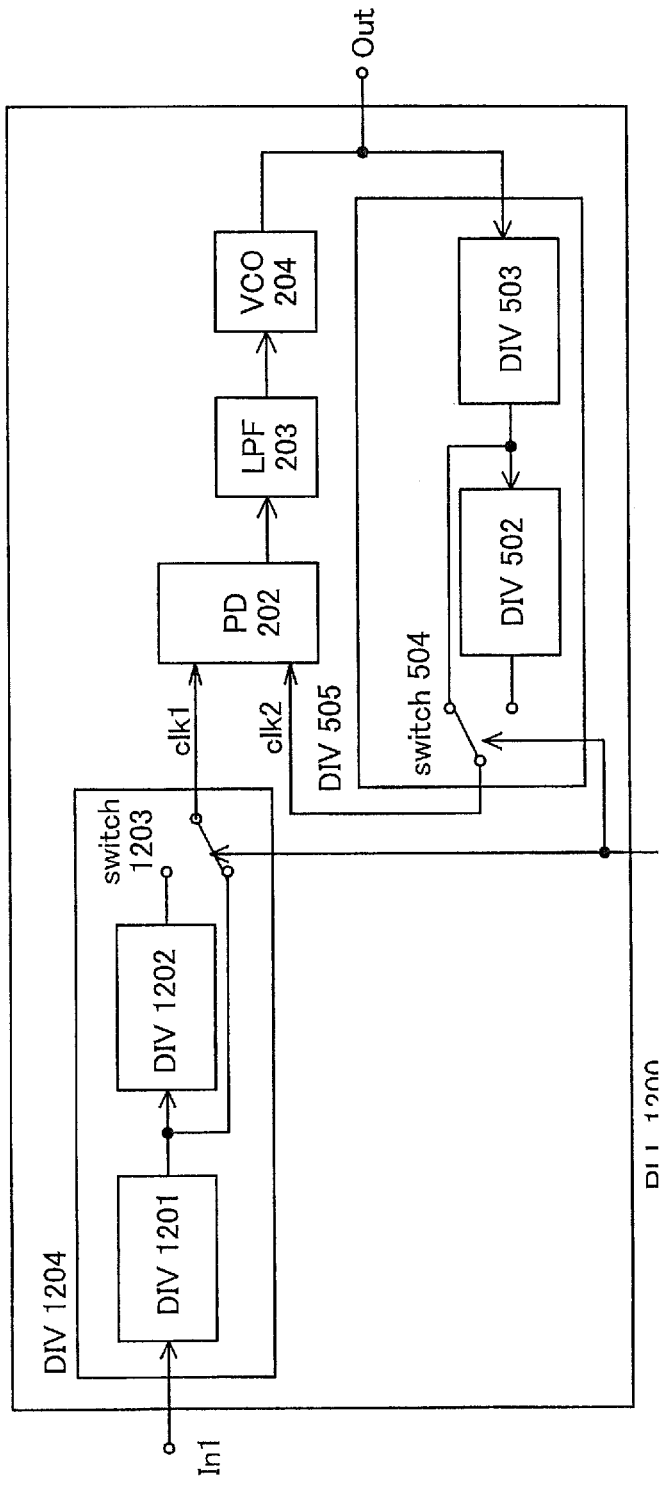
FIG. 12 is a block diagram of a PLL included in a semiconductor device of the present invention.

FIG. 12 shows an example of a circuit structure of a PLL included in a semiconductor device of the present invention.

In FIG. 12, a PLL 1200 includes a divider circuit (DIV) 1204, the divider circuit (DIV) 505, the phase comparator circuit (also referred to as a phase detector (PD)) 202, the loop filter (LPF) 203, and the voltage control oscillation circuit (VCO) 204. An input signal In1 and an input signal In2 are inputted to the PLL 1200, and the PLL 1200 outputs an output signal Out.

A signal clk1 and a signal clk2 are inputted to the phase comparator circuit 202, and the phase comparator circuit 202 performs phase comparison. The LPF 203 is a low-pass filter and averages an output of the phase comparator circuit. The output signal of the LPF 203, which is an averaged phase comparison result, is inputted to the VCO 204, and the VCO 204 determines an oscillation frequency based on the output signal.

The divider circuit 1204 includes a divider circuit 1201, a divider circuit 1202, and a switch 1203. The input signal In1 is inputted to the divider circuit 1204, and the divider circuit 1204 generates a signal clk1 having ½ frequency or 1/16 frequency. The frequency of the signal clk1 is switched back and forth between ½ frequency and 1/16 frequency with the input signal In2. The divider circuit 505 includes the divider circuit 502, the divider circuit 503, and the switch 504. An output signal of the VCO 204 is inputted to the divider circuit 505, and the divider circuit 505 generates a signal clk2 having 1/8 frequency or 1/64 frequency. The frequency of the signal clk2 is switched back and forth between 1/8 frequency and 1/64 frequency with the input signal In2.

The PLL 1200 shown in FIG. 12 has a structure in which the divider circuit is switched with the input signal In2. Specifically, by switching back and forth between a state where the frequency of the input signal In1 which is divided by 16 is set as the signal clk1 and the frequency of the output signal of the VCO 204 which is divided by 64 is set as the signal clk2 and a state where the frequency of the input signal In1 which is divided by 2 is set as the signal clk1 and the frequency of the output signal of the VCO 204 which is divided by 8 is set as the signal clk2, characteristics of the PLL 1200 change without changing the ratio of the frequencies of the input signal In1 and the output signal Out.

For example, an oscillation frequency of the VCO at the time of free-running is 4 times larger than that of the input signal In1, the signal clk1 is 1/16 of an input signal In1 and the signal clk2 is 1/64 of the output signal of the VCO 204 in a data reception period, and the signal clk1 is set as 1/2 of the input signal In1 and the signal clk2 is 1/8 of the output signal of the VCO 204 in a data transmission period; accordingly, the operating range of a wireless tag can be improved. This is described as follows.

In the data reception period, the lock range of the PLL is preferably wide so that decoding operation is performed correctly. The lock range of the PLL is wider when the frequency of the signal clk2 is low. This is the same as that a lock range is wider when a time constant is small, with relation to the frequency of the signal clk2 and a time constant of the loop filter. That is, when the frequency of the signal clk2 is high, feedback is weakened due to attenuation by the low-pass filter, and a transient characteristic of the PLL becomes worse. Then, when the power supply voltage is changed, PLL needs to fit the free-running oscillation frequency to the frequency of the signal clk1. However, when the frequency of the signal clk2 is high, a lock easily comes off, because the frequency of the PLL fits the predetermined frequency slowly because it is difficult to change the frequency of the PLL, therefore, the lock range is narrowed. Needless to say, even when the frequency of the signal clk2 is too low, feedback of the PLL is slow; therefore, there is a limit. For example, the frequency of the signal clk2 is preferably $(1/(2\times\tau 1))$ to $(2/\tau 1)$ where a time constant is set as $\tau$.

In the data transmission period, it is preferable that a change of the free-running oscillation frequency be small so that reply operation is performed correctly. In order to suppress the change of the free-running oscillation frequency, it is preferable that feedback of the PLL be performed fast, that is, it is preferable that the frequency of the signal clk2 which performs phase comparison be fast. Depending on to what extent the change of the free-running oscillation frequency needs to be suppressed, the frequency of the signal clk2 in the data transmission period is preferably 2 to 128 times larger than the frequency of the signal clk2 in the data reception period. The PLL 1200 shown in FIG. 12 can reduce the change of the free-running oscillation frequency when the divider circuit 505 is a divide-by-16 frequency divider and the divider circuit 1204 is a divide-by-2 frequency divider.

As a result, in particular, during the period in which the wireless tag transmits data, a structure having a small change of the free-running oscillation frequency is realized. In this way, the PLL 1200 of the present invention shown in FIG. 12 and a semiconductor device which incorporates the PLL can realize a wide operating range.

By using such a PLL 1200, in a plurality of periods such as the data reception period and the data transmission period, a PLL can be formed so as to be suited for each period, and a semiconductor device having a wide operating range can be realized. Note that the number of control signals is not necessarily just one, and control can be performed with a plurality of control signals.

Note that the structure of the semiconductor device described in this embodiment can be combined with a structure of semiconductor devices described in other embodiment modes and embodiments in this specification.

Embodiment 4

Figure 6:
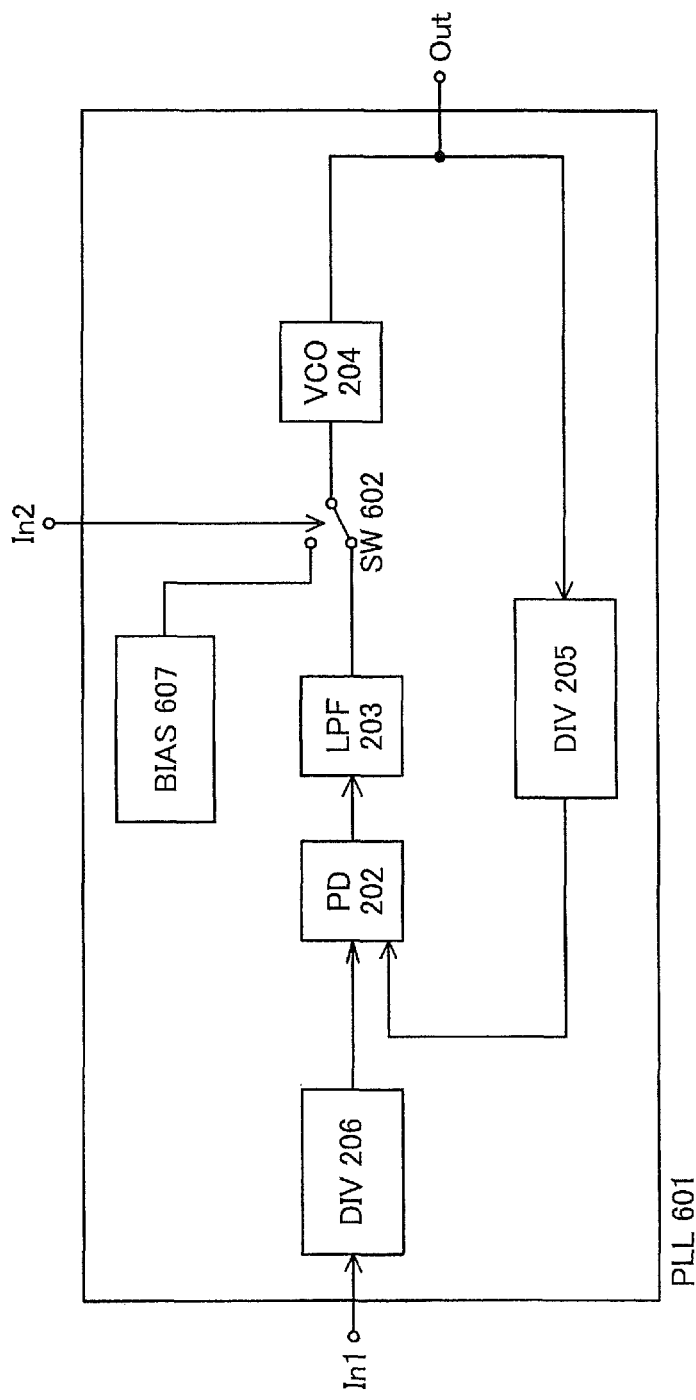
FIG. 6 is a block diagram of a PLL included in a semiconductor device of the present invention.

FIG. 6 shows an example of a circuit structure of a PLL included in a semiconductor device of the present invention.

In FIG. 6, a PLL 601 includes the divider circuit (DIV) 206, the divider circuit (DIV) 205, the phase comparator circuit (also referred to as a phase detector (PD)) 202, the loop filter (LPF) 203, the voltage control oscillation circuit (VCO) 204, a bias circuit (BIAS) 607, and a switch (SW) 602. An input signal In1 and an input signal In2 are inputted to the PLL 601, and the PLL 601 outputs an output signal Out.

A signal clk1 and a signal clk2 are inputted to the phase comparator circuit 202, and the phase comparator circuit 202 performs phase comparison. The LPF 203 is a low-pass filter and averages an output of the phase comparator circuit. Either one of an output signal of the LPF 203 and an output signal of the bias circuit 607, which is selected by the switch 602, is inputted to the VCO 204, and the VCO 204 determines an oscillation frequency based on the output signal. The output signal Out is inputted to the divider circuit 205 (which is a divide-by-N frequency divider), and the divider circuit 205 generates a signal clk2 having 1/N frequency. The input signal In1 is inputted to the divider circuit 206 (which is a divide-by-M frequency divider), and the divider circuit 206 generates a signal clk1 having 1/M frequency.

The PLL 601 shown in FIG. 6 has a structure in which an input signal of the VCO 204 is switched with the input signal In2. When an output signal of the LPF 203 is inputted to the VCO 204, the VCO 204 generates a signal in synchronization with the input signal In1 as the output signal Out; however, when an output signal of the bias circuit 607 is inputted to the VCO 204, the VCO 204 is not a feedback circuit but just an oscillator circuit.

For example, an output signal of the LPF 203 is inputted to the VCO 204 in a data reception period, and an output signal of the bias circuit 607 is inputted to the VCO 204 in a data transmission period; accordingly, the operating range of a wireless tag can be improved. This is described as follows.

In the data reception period, a structure is provided in which the output signal of the LPF 203 is inputted to the VCO 204 so that decoding operation is performed correctly. In the structure in which the output signal of the bias circuit 607 is inputted to the VCO 204, feedback is not performed; therefore, decoding operation is incapable of being performed.

In the data transmission period, since a receiving electric wave is not modulated, the input signal In1 is not necessarily locked, and it is preferable that a change of the free-running oscillation frequency be small so that reply operation is performed correctly. The change of the free-running oscillation frequency depends on a change of the power supply voltage and the speed of the feedback of the PLL 601; however, it can be thought that a receiving electric wave is not modulated and the change of the power supply voltage Vdd is small, and in addition, it can be thought that it is important to perform the feedback of the PLL 601 fast in the data transmission period.

In the structure shown in FIG. 6, the output signal of the bias circuit 607 is inputted to the VCO 204 and the feedback of the PLL 601 itself is eliminated; therefore, the change of the oscillation frequency can be reduced. Needless to say, the output signal of the bias circuit 607 has a potential which is designed to obtain the output signal Out having a predetermined frequency.

With such a structure, during the period in which the wireless tag transmits data, the change of the free-running oscillation frequency can be reduced. As a result, the PLL 601 of the present invention shown in FIG. 6 and a semiconductor device which incorporates the PLL can realize a wide operating range in this way.

By using such a PLL, in a plurality of periods, a PLL can be formed so as to be suited for each period, and a semiconductor device having a wide operating range can be realized.

Note that the structure of the semiconductor device described in this embodiment can be combined with a structure of semiconductor devices described in other embodiment modes and embodiments in this specification.

Embodiment 5

As for improvement of the operating range of a wireless tag, an example will be described in which a characteristic of a PLL that is different from changes in the lock range and the free-running oscillation frequency is paid attention.

For example, it is necessary to keep the free-running oscillation frequency of the PLL constant during a period in which the wireless tag transmits data; however, since power consumption of a semiconductor device varies in periods A and B in a data transmission period, a power supply voltage slightly varies in the periods A and B in some cases. As the operation of large power consumption, for example, write operation to a memory is given. That is, the following can be thought: a period of write operation to the memory as the period A, a period in which write operation is not performed to the memory as the period B, or the like. A control signal which switches such periods can be generated with a memory control circuit.

In such a case, it is effective to switch a load of a VCO in the periods A and B or to shift a potential of the input signal of the VCO. As a result, the free-running oscillation frequency can be controlled, and the operating range of the wireless tag can be improved.

Figure 7:
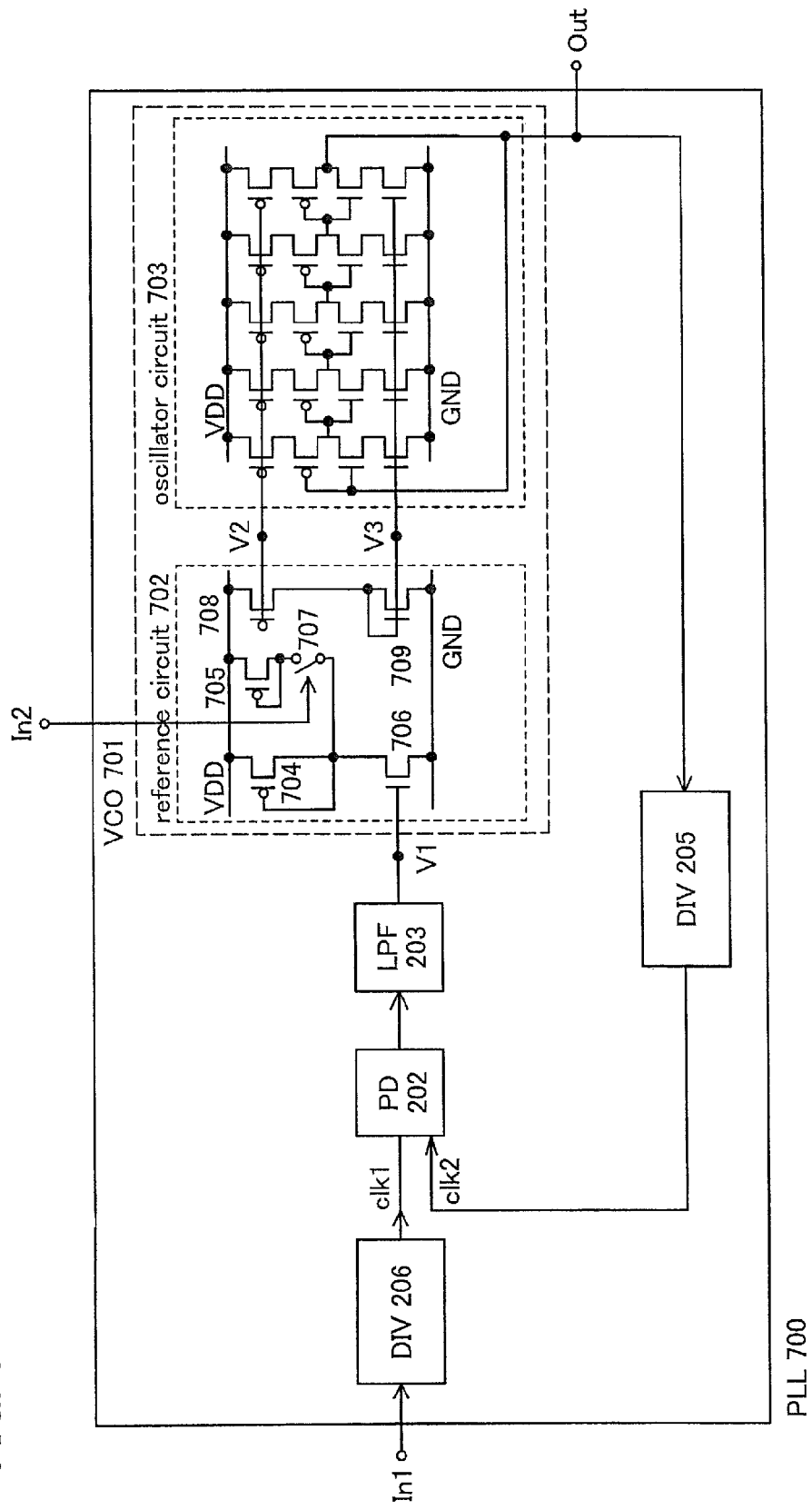
FIG. 7 is a circuit diagram of a PLL included in a semiconductor device of the present invention.

FIG. 7 shows an example of a circuit structure of a PLL included in a semiconductor device of the present invention.

In FIG. 7, a PLL 700 includes the divider circuit (DIV) 206, the divider circuit (DIV) 205, the phase comparator circuit (also referred to as a phase detector (PD)) 202, the loop filter (LPF) 203, and a voltage control oscillation circuit (VCO) 701. An input signal In1 and an input signal In2 are inputted to the PLL 700, and the PLL 700 outputs an output signal Out.

A signal clk1 and a signal clk2 are inputted to the phase comparator circuit 202, and the phase comparator circuit 202 performs phase comparison. The LPF 203 is a low-pass filter and averages an output of the phase comparator circuit. The potential V1 and the input signal In2 are inputted to the VCO 701, and the VCO 701 includes a reference circuit 702 which generates the potential V2 and the potential V3, and an oscillator circuit 703 which controls a frequency with the potential V2 and the potential V3. The reference circuit 702 includes two N-channel transistors 706 and 709; three P-channel transistors 704, 705, and 708; and a switch 707. The oscillator circuit 703 has a five-stage structure, and each stage includes two N-channel transistors and two P-channel transistors. The output signal Out is inputted to the divider circuit 205 (which is a divide-by-N frequency divider), and the divider circuit 205 generates a signal clk2 having 1/N frequency. The input signal In1 is inputted to the divider circuit 206 (which is a divide-by-M frequency divider), and the divider circuit 206 generates a signal clk1 having 1/M frequency.

The PLL 700 shown in FIG. 7 has a feature that the free-running oscillation frequency varies in accordance with the input signal In2 and the free-running oscillation frequency is lower when the switch 707 is in an on state than when the switch 707 is in an off state. This is described as follows.

The reference circuit 702 determines the potential V2 with respect to the potential V1 by series connection of the P-channel transistor 704 and the N-channel transistor 706, and determines the potential V3 with respect to the potential V2 by series connection of the P-channel transistor 708 and the N-channel transistor 709. The switch 707 is turned on, so that the P-channel transistor 704 and the P-channel transistor 705 are connected in parallel; therefore, the reference circuit 702 has an effect that the channel width of the P-channel transistor 704 is increased. As the channel width of the P-channel transistor 704 in the reference circuit 702 is wider, the potential V2 increases and the potential V3 decreases. Accordingly, the switch 707 is turned on, so that the potential V2 increases and the potential V3 decreases.

In addition, since the oscillator circuit 703 has a structure in which an oscillation frequency is lower as the potential V3 is high and the potential V2 is low, it is found that the free-running oscillation frequency is lower when the switch 707 is in an on state than when the switch 707 is in an off state.

When the PLL 700 having the structure shown in FIG. 7 is used, the operating range of the semiconductor device of the present invention can be improved.

For example, the following case is thought: the case where the operating range becomes maximum when a power supply voltage in a period 1 is set as Vdd1 and a power supply voltage in a period 2 is set as Vdd2 (Vdd2>Vdd1) during the period in which the wireless tag operates and the free-running oscillation frequency of the VCO 701 is constant in both periods. An example in which a power supply voltage is changed in the above-described data transmission period corresponds to this case.

If the PLL 700 is not switched in the period 1 and the period 2, the free-running oscillation frequency increases in the period 2 in which the power supply voltage is high. Therefore, when the free-running oscillation frequency in the period 2 is decreased more than that in the period 1 in the PLL 700 shown in FIG. 7, the frequency of the period 1 and the frequency of the period 2 can be equal to each other, and the operating range of the wireless tag can be improved.

With such a structure, during the period in which the wireless tag transmits data, the change of the free-running oscillation frequency can be reduced. As a result, the PLL of the present invention shown in FIG. 7 and a semiconductor device which incorporates the PLL can realize a wide operating range in this way.

By using such a PLL, in a plurality of periods, a PLL can be formed so as to be suited for each period, and a semiconductor device having a wide operating range can be realized.

Note that the structure of the semiconductor device described in this embodiment can be combined with a structure of semiconductor devices described in other embodiment modes and embodiments in this specification.

Embodiment 6

In this embodiment, a circuit structure which differs from that of Embodiment 5 but has the same object as the example described in Embodiment 5 will be described.

Figure 8:
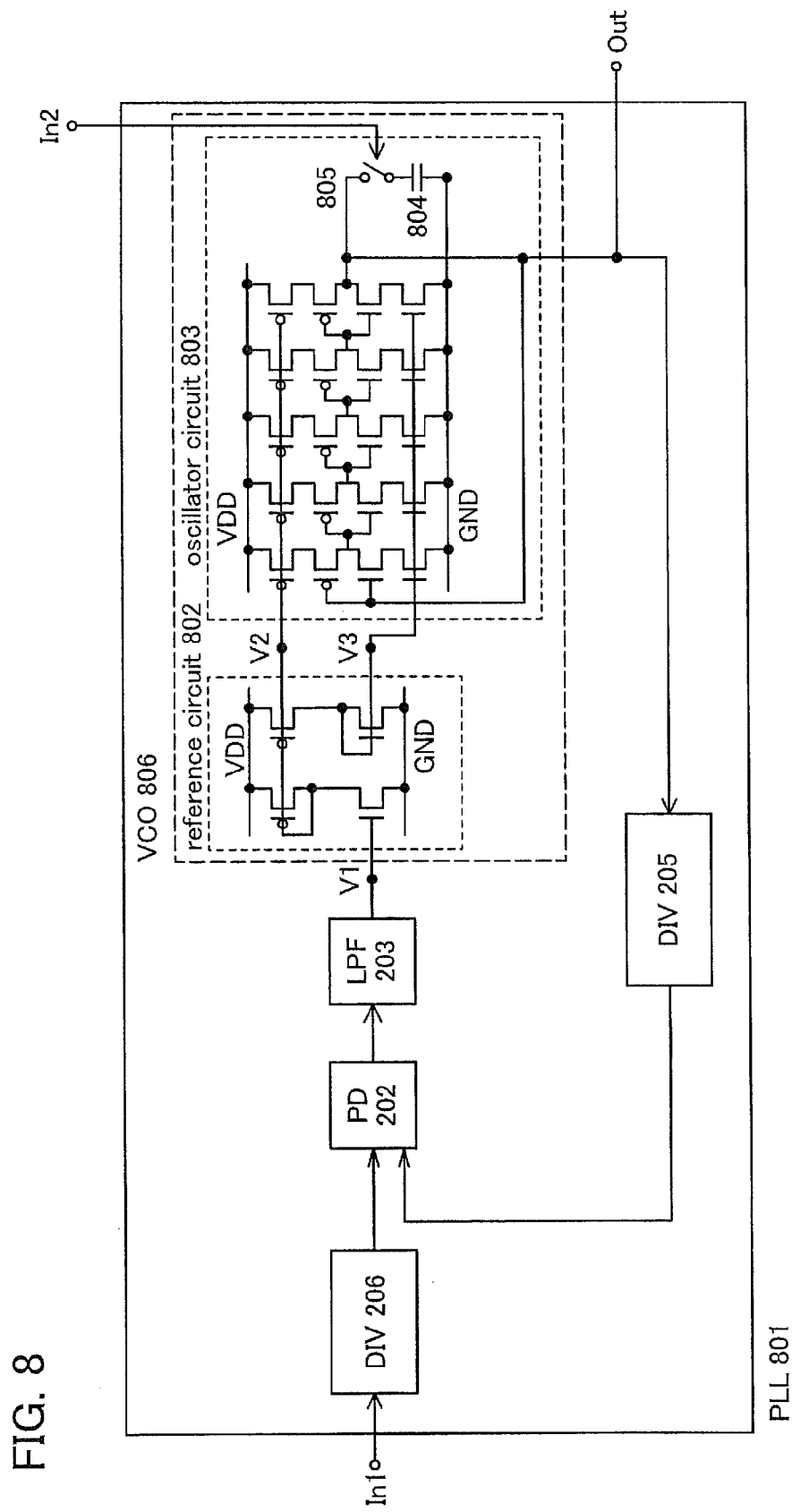
FIG. 8 is a circuit diagram of a PLL included in a semiconductor device of the present invention.
Figure 9:
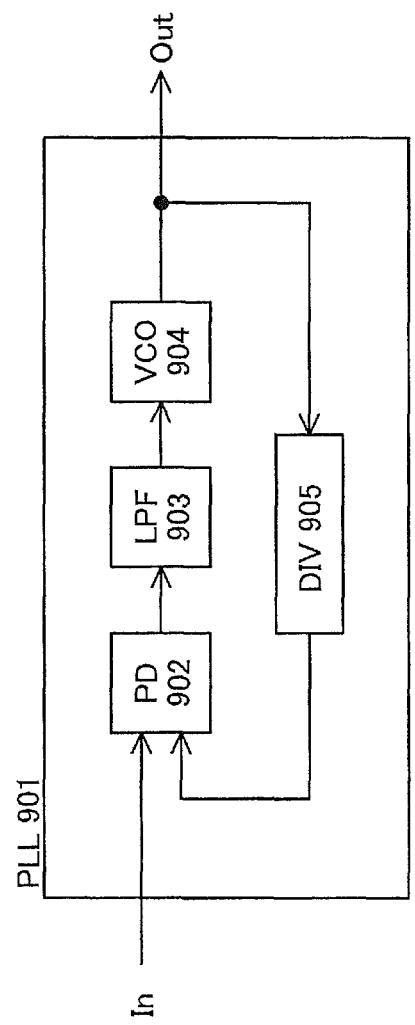
FIG. 9 is a block diagram showing a structure of a general PLL.
Figure 10:
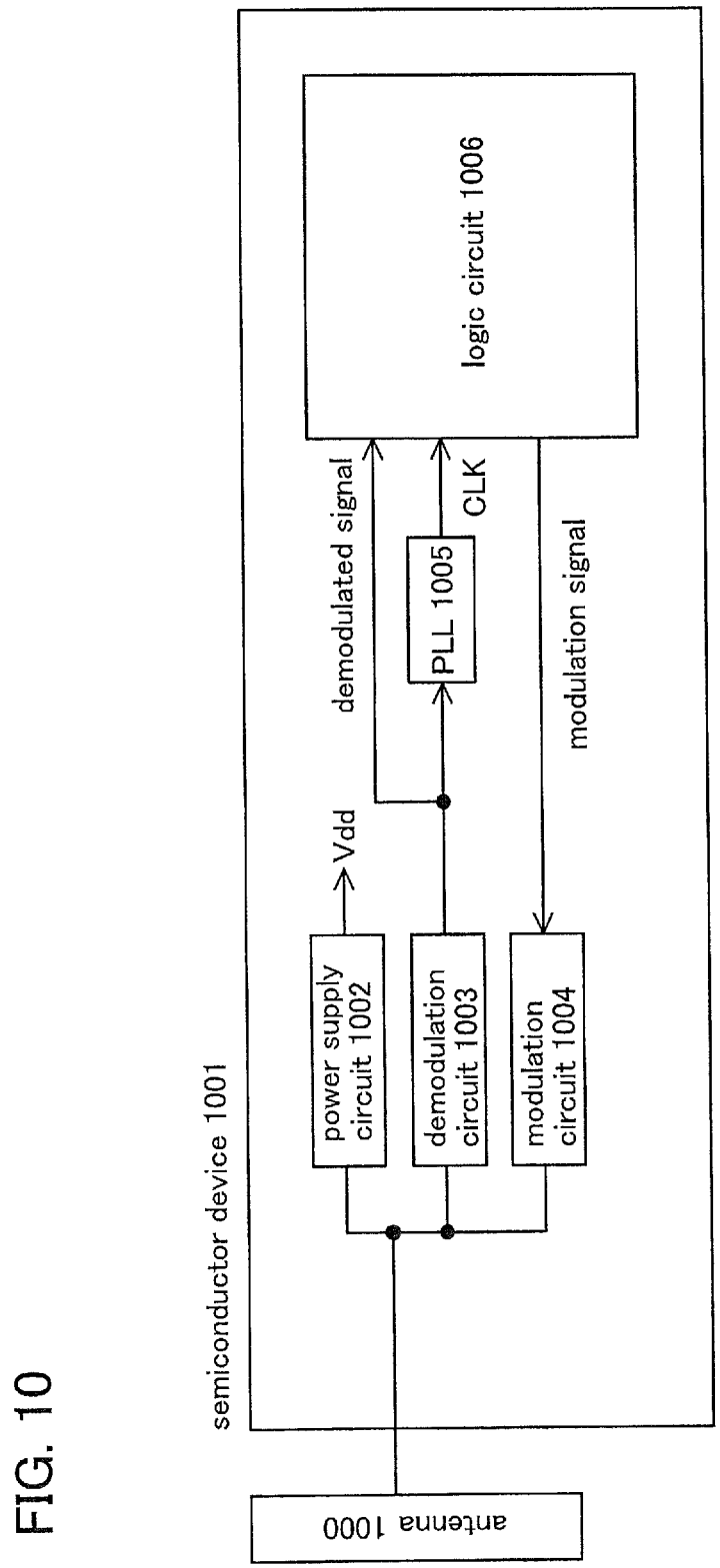
FIG. 10 is a block diagram showing a structure of a general semiconductor device.

FIG. 8 shows an example of a circuit structure of a PLL included in a semiconductor device of the present invention.

In FIG. 8, a PLL 801 includes the divider circuit (DIV) 206, the divider circuit (DIV) 205, the phase comparator circuit (also referred to as a phase detector (PD)) 202, the loop filter (LPF) 203, and a voltage control oscillation circuit (VCO) 806. An input signal In1 and an input signal In2 are inputted to the PLL 801, and the PLL 801 outputs an output signal Out.

A signal clk1 and a signal clk2 are inputted to the phase comparator circuit 202, and the phase comparator circuit 202 performs phase comparison. The LPF 203 is a low-pass filter and averages an output of the phase comparator circuit. The potential V1 and the input signal In2 are inputted to the VCO 806, and the VCO 806 includes a reference circuit 802 which generates the potential V2 and the potential V3, and an oscillator circuit 803 which controls a frequency with the potential V2 and the potential V3.

The reference circuit 802 includes two N-channel transistors and three P-channel transistors. The oscillator circuit 803 has a five-stage structure, and each stage includes two N-channel transistors and two P-channel transistors. In addition, the oscillator circuit 803 includes a switch (SW) 805 and a capacitor 804. The output signal Out is inputted to the divider circuit 205 (which is a divide-by-N frequency divider), and the divider circuit 205 generates a signal clk2 having 1/N frequency. The input signal In1 is inputted to the divider circuit 206 (which is a divide-by-M frequency divider), and the divider circuit 206 generates a signal clk1 having 1/M frequency.

The PLL 801 shown in FIG. 8 has a feature that the free-running oscillation frequency varies in accordance with the input signal In2 and the free-running oscillation frequency is lower when the switch 805 is in an on state than when the switch 805 is in an off state. This is because the capacitor 804 is added as a load of the oscillator circuit 803 when the switch 805 is turned on.

When the PLL 801 having the structure shown in FIG. 8 is used, the operating range of the semiconductor device of the present invention can be improved.

For example, the following case is thought: the case where the operating range becomes maximum when a power supply voltage in a period 1 is set as Vdd1 and a power supply voltage in a period 2 is set as Vdd2 (Vdd2>Vdd1) during the period in which a wireless tag operates and the free-running oscillation frequency of the VCO 806 is constant in both periods. An example in which a power supply voltage is changed in the above-described data transmission period corresponds to this case.

If the PLL 801 is not switched in the period 1 and the period 2, the free-running oscillation frequency increases in the period 2 in which the power supply voltage is high. Therefore, when the free-running oscillation frequency in the period 2 is decreased more than that in the period 1 in the PLL 801 shown in FIG. 8, the frequency of the period 1 and the frequency of the period 2 can be equal to each other, and the operating range of the wireless tag can be improved.

With such a structure, during the period in which the wireless tag transmits data, the change of the free-running oscillation frequency can be reduced. As a result, the PLL of the present invention shown in FIG. 8 and a semiconductor device which incorporates the PLL can realize a wide operating range in this way.

By using such a PLL, in a plurality of periods, a PLL can be formed so as to be suited for each period, and a semiconductor device having a wide operating range can be realized.

Note that the structure of the semiconductor device described in this embodiment can be combined with a structure of semiconductor devices described in other embodiment modes and embodiments in this specification.

Embodiment 7

In this embodiment, an example in which a battery is provided in a semiconductor device of the present invention will be described with reference to the drawing.

An example of a semiconductor device described in this embodiment will be described with reference to FIG. 13. A semiconductor device 1501 shown in FIG. 13 includes the antenna 100, an antenna 1502, a power supply portion 1508, and a signal processor 1507.

The power supply portion 1508 includes a power supply circuit 1503, a charge control circuit 1504, a battery 1505, and a discharge control circuit 1506. In addition, the signal processor 1507 includes the demodulation circuit 103, the modulation circuit 104, the PLL 105, and the logic circuit 106.

Operation of the signal processor 1507 is described. The demodulation circuit 103 extracts information from the alternating current signal inputted from the antenna 100 and outputs a demodulated signal. For example, in the case of amplitude modulation (ASK), the demodulation circuit 103 generates a demodulated signal by rectification and filtering. A modulation signal is inputted to the modulation circuit 104, and the impedance of the semiconductor device 1501 is changed by load modulation or the like. Accordingly, a wireless tag transmits a response signal. A clock signal and a demodulated signal are inputted to the logic circuit 106, and the logic circuit 106 outputs a modulation signal. The demodulated signal is inputted to the decode circuit 107 included in the logic circuit 106, and the decode circuit 107 converts (decodes) a received signal into "0" or "1" and generates a data signal, or the decode circuit 107 recognizes an SOF and an EOF and generates various control signals. The logic circuit 106 includes a command analysis portion, a check circuit (which checks integrity of received data), a memory, a memory control circuit, an output circuit (which generates a modulation signal), or the like, as well as the decode circuit, and performs processing in accordance with a received command.

A demodulated signal which is the output of the demodulation circuit 103 and a control signal are inputted to the PLL 105, and the PLL 105 outputs a clock signal CLK to serve as a reference of the logic circuit 106. The control signal is a signal which is generated by the decode circuit 107 or another portion of the logic circuit 106 and controls the switching of the PLL 105.

Note that a primary difference between the structure of FIG. 1 described in Embodiment Mode 1 and the structure of this embodiment is that the power supply portion 1508 is provided in the semiconductor device 1501.

Figure 13:
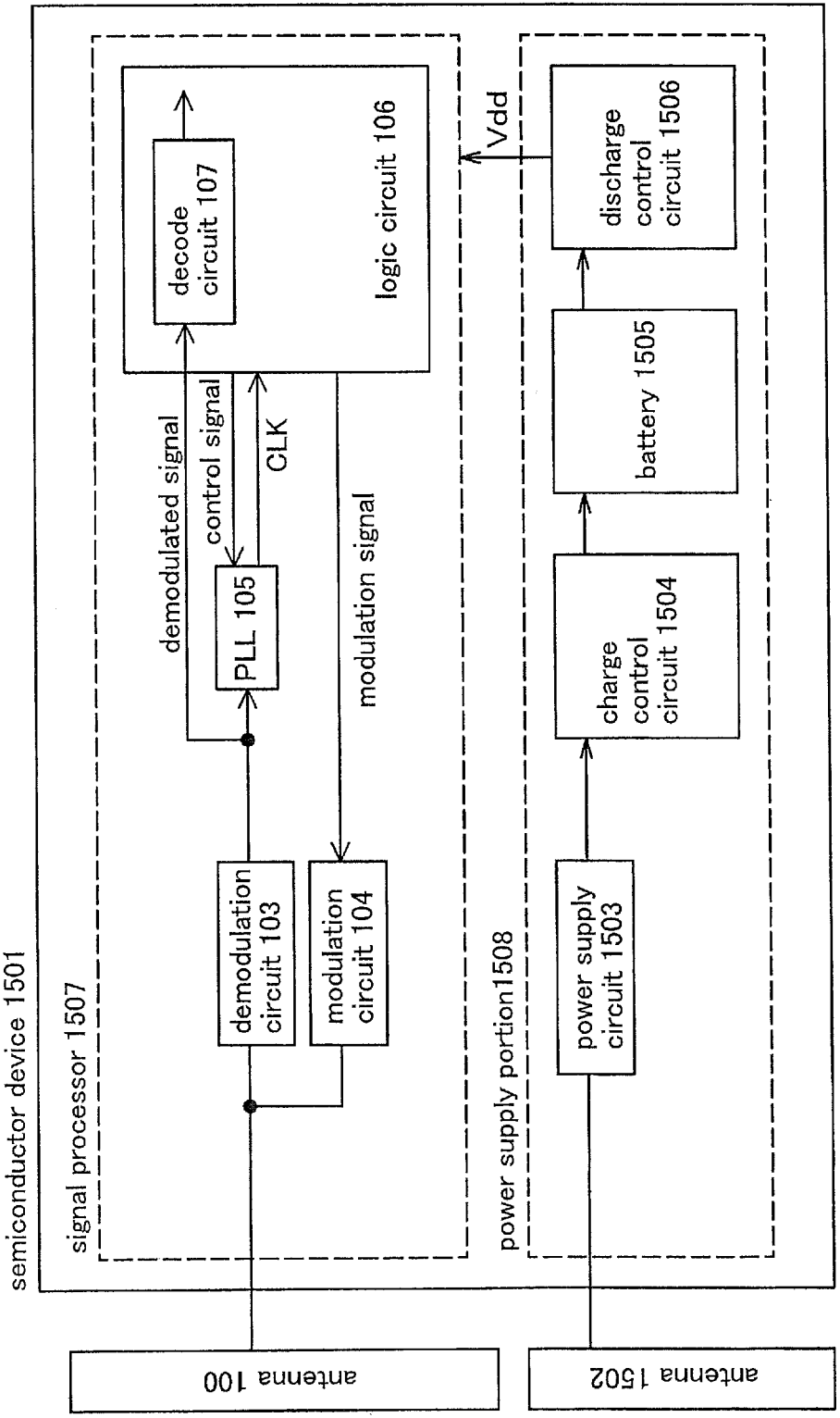
FIG. 13 is a block diagram showing a structure of a semiconductor device of the present invention.

In addition, a power source of the signal processor 1507 in FIG. 13 is supplied with the battery 1505 through the discharge control circuit 1506.

Next, operation of the power supply portion 1508 is described. The power supply circuit 1503 rectifies an alternating current signal inputted from the antenna 1502 and outputs the potential V1 which has been smoothed. The smoothed potential is inputted to the charge control circuit 1504, and the battery starts charging. The charge control circuit 1504 may have a structure in which a voltage detection circuit is included and charging is started when the potential V1 reaches a certain value or more. In addition, in order to prevent overcharging of the battery, the charge control circuit 1504 may have a structure in which the potential V2 of the battery is inputted to the charge control circuit 1504 and in which charging is stopped when the potential V2 reaches a certain value or more.

The potential V2 of the battery is inputted to the discharge control circuit 1506, and the discharge control circuit 1506 outputs a power supply voltage Vdd. The discharge control circuit 1506 may have a structure in which a voltage detection circuit is included and electric discharge is started when the potential V2 reaches a certain value or more. Alternatively, the discharge control circuit 1506 may have a structure in which a voltage detection circuit is included and electric discharge is stopped when the potential V2 reaches a certain value or less.

The antenna 100 has a structure which meets the communication standard of the wireless tag. When a communication signal has 13.56 MHz, the antenna 100 is set as an antenna (typically, a coil antenna) for 13.56 MHz band.

As this time, the antenna 1502 may be set as an antenna for 13.56 MHz band, and a frequency of an electromagnetic wave from a reader/writer for charging the battery 1505 may be shared. In that case, by making a signal for charging and a signal for communication have the same frequency band, the antenna 1502 can be shared. When the antenna 1502 is shared, the semiconductor device can be downsized.

In addition, the antenna 1502 may have a structure which receives an external electromagnetic wave generated at random. In that case, the antenna 1502 takes in a weak external electromagnetic wave generated at random, and the battery 1505 is charged little by little.

As described above, the present invention can be provided with a battery which can be charged wirelessly. Accordingly, by using a battery power source, a wireless tag which has a wider operating range, for example, expansion of a communication range or the like can be realized.

Note that the structure of the semiconductor device described in this embodiment can be combined with a structure of semiconductor devices described in other embodiment modes and embodiments in this specification.

Embodiment 8

An example of a semiconductor device described in this embodiment will be described with reference to FIG. 14. A semiconductor device 1601 shown in FIG. 14 includes the antenna 100, an antenna 1602, a power supply portion 1610, and a signal processor 1609.

The power supply portion 1610 includes a power supply circuit 1603, a demodulation circuit 1604, a modulation circuit 1605, a charge circuit 1606, a discharge circuit 1611, a charge and discharge control circuit 1607, and a battery 1608. In addition, the signal processor 1609 includes the power supply circuit 102, the demodulation circuit 103, the modulation circuit 104, the PLL 105, and the logic circuit 106.

Operation of the signal processor 1609 is described. The power supply circuit 102 rectifies the alternating current signal inputted from the antenna 100 and generates a predetermined voltage. The demodulation circuit 103 extracts information from the alternating current signal inputted from the antenna 100 and outputs a demodulated signal. For example, in the case of amplitude modulation (ASK), the demodulation circuit 103 generates a demodulated signal by rectification and filtering. A modulation signal is inputted to the modulation circuit 104, and the impedance of the semiconductor device 1601 is changed by load modulation or the like. Accordingly, a wireless tag transmits a response signal. A clock signal and a demodulated signal are inputted to the logic circuit 106, and the logic circuit 106 outputs a modulation signal. The demodulated signal is inputted to the decode circuit 107 included in the logic circuit 106, and the decode circuit 107 converts (decodes) a received signal into "0" or "1" and generates a data signal, or the decode circuit 107 recognizes an SOF and an EOF and generates various control signals. The logic circuit includes a command analysis portion, a check circuit (which checks integrity of received data), a memory, a memory control circuit, an output circuit (which generates a modulation signal), or the like, as well as the decode circuit, and performs processing in accordance with a received command.

A demodulated signal which is the output of the demodulation circuit 103 and a control signal are inputted to the PLL 105, and the PLL 105 outputs a clock signal CLK to serve as a reference of the logic circuit. The control signal is a signal which is generated by the decode circuit 107 or another portion of the logic circuit 106 and controls the switching of the PLL 105.

Note that a difference between the structure of FIG. 1 described in Embodiment Mode 1 and the structure of this embodiment is that the power supply portion 1610 is provided in the semiconductor device 1601.

Figure 14:
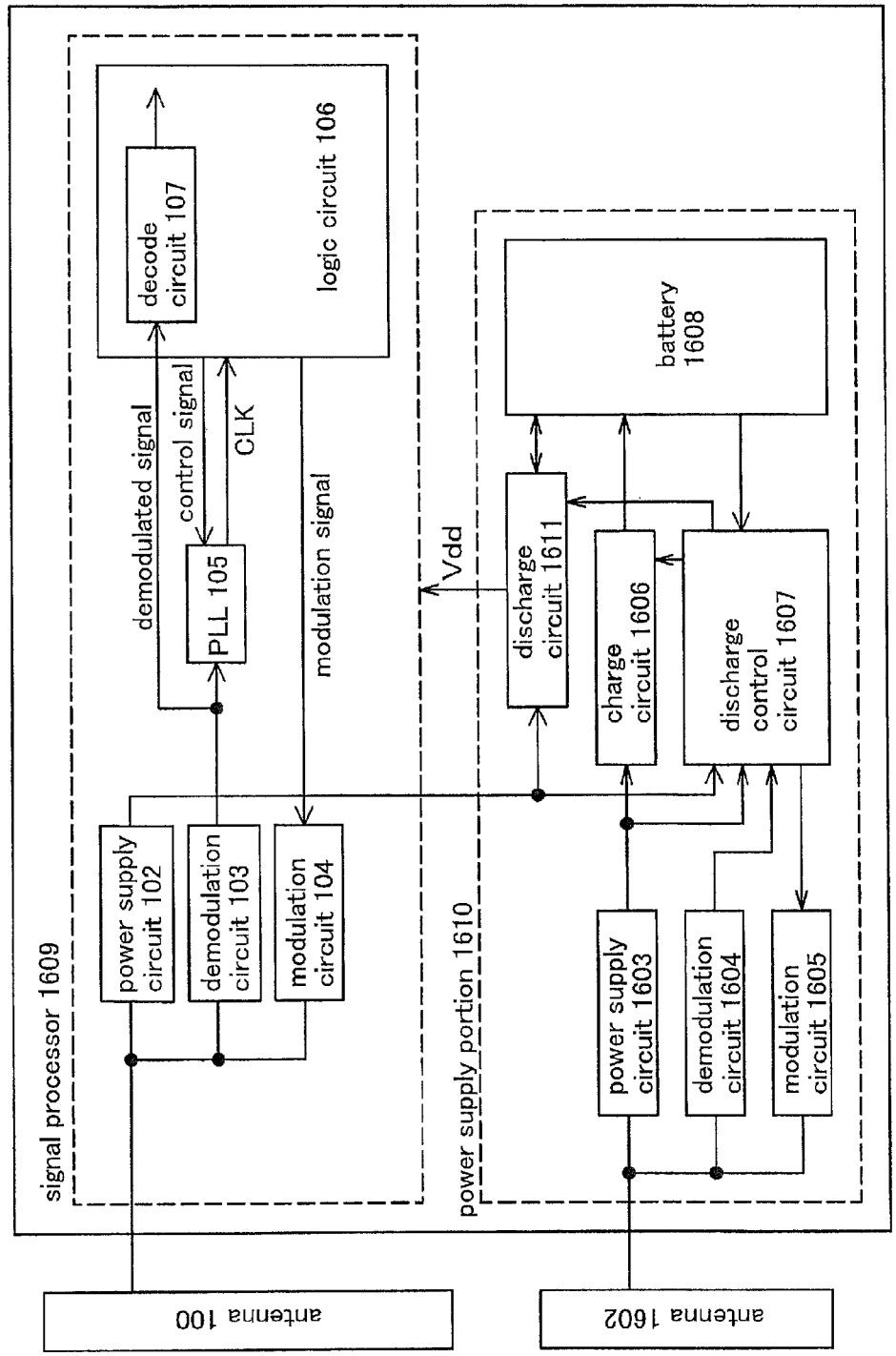
FIG. 14 is a block diagram showing a structure of a semiconductor device of the present invention.

In addition, a power source of the signal processor 1609 in FIG. 14 is supplied from the power supply portion 1610. In the power supply portion 1610, a power source is mainly supplied from the battery. When the power supply circuit 1603 generates a sufficient voltage as a power source, part or entire power source is supplied from the power supply circuit 102 under the control of the power supply portion 1610.

Next, operation of the power supply portion 1610 is described. The power supply circuit 1603 rectifies an alternating current signal inputted from the antenna 1602 and outputs a potential which has been smoothed. The smoothed potential is inputted to the charge circuit 1606, and the battery 1608 is charged under the control of the charge and discharge control circuit 1607. A potential of the battery 1608 is inputted to the discharge circuit 1611, and a power supply voltage Vdd is supplied to the signal processor 1609 under the control of the charge and discharge control circuit 1607.

A demodulated signal which is an output of the demodulation circuit 1604, an output potential V1 of the power supply circuit 1603, an output potential V3 of the power supply circuit 102, and an output potential V2 of the battery 1608 are inputted to the charge and discharge control circuit 1607; the charge and discharge control circuit 1607 outputs control signals to the charge circuit 1606 and the discharge circuit 1611 and outputs a modulation signal to the modulation circuit 1605. The charge and discharge control circuit 1607 controls the timing of charging and discharging, based on the demodulated signal and a potential outputted from the power supply circuit 1603, the power supply circuit 102, or the battery 1608. In addition, the charge and discharge control circuit 1607 outputs information related to charging and discharging of the battery 1608 as a modulation signal.

For example, by inputting a demodulated signal, the charge and discharge control circuit 1607 can perform charging and discharging based on a signal which is transmitted by a reader/writer or can set conditions for charging and discharging. In addition, by inputting the potentials V1, V2, and V3, operation that charging is performed when the charging of the battery 1608 is not sufficient and the power supply circuit 1603 is at a state capable of charging, operation that power supply from the battery 1608 is stopped and a power source is supplied from the power supply circuit 102 when the potential V2 of the power supply circuit 102 is sufficient as the power source of the signal processor 1609, or the like can be performed.

Note that the demodulation circuit 1604 extracts information from the alternating current signal inputted from the antenna 1602 and outputs a demodulated signal. In addition, a modulation signal is inputted to the modulation circuit 1605, so that the impedance of the semiconductor device 1601 is changed by load modulation or the like. Accordingly, the wireless tag transmits a signal.

The antenna 100 has a structure which meets the communication standard of the wireless tag. When a communication signal has 13.56 MHz, the antenna 100 is set as an antenna (typically, a coil antenna) for 13.56 MHz band.

As this time, the antenna 1602 may also be set as an antenna for 13.56 MHz band, and a frequency of an electromagnetic wave from the reader/writer for charging the battery 1608 may be shared. In that case, by making a signal for charging and a signal for communication have the same frequency band, the antenna 1602 can be shared. When the antenna 1602 is shared, the semiconductor device 1601 can be downsized.

In addition, the antenna 1602 may have a structure which receives an external electromagnetic wave generated at random. In that case, the antenna 1602 takes in a weak external electromagnetic wave generated at random, and the battery 1608 is charged little by little.

As described above, the present invention can be provided with a battery which can be charged wirelessly. Accordingly, by using a battery power source, the wireless tag which has a wider operating range, for example, expansion of a communication range or the like can be realized.

Note that the structure of the semiconductor device described in this embodiment can be combined with a structure of semiconductor devices described in other embodiment modes and embodiments in this specification.

Embodiment 9

In this embodiment, uses of a wireless tag, which is an example of application modes of a semiconductor device of the present invention, will be described. A wireless tag can be used as a so-called ID label, ID tag, or ID card provided in, for example, bills, coins, securities, bearer bonds, documents (such as driver's licenses or resident's cards), packaging containers (such as wrapping paper or bottles), storage media (such as DVD software or video tapes), vehicles (such as bicycles), personal belongings (such as bags or glasses), foods, plants, animals, human bodies, clothing, everyday articles, tags on products such as an electronic device or on packs. An electronic device refers to a liquid crystal display device, an EL display device, a television set (also simply called a TV set, a TV receiver, or a television receiver), a cellular phone, and the like. Hereinafter, an application of the present invention and an example of a product with the wireless tag are described with reference to FIGS. 15A to 15E.

Figure 15A:
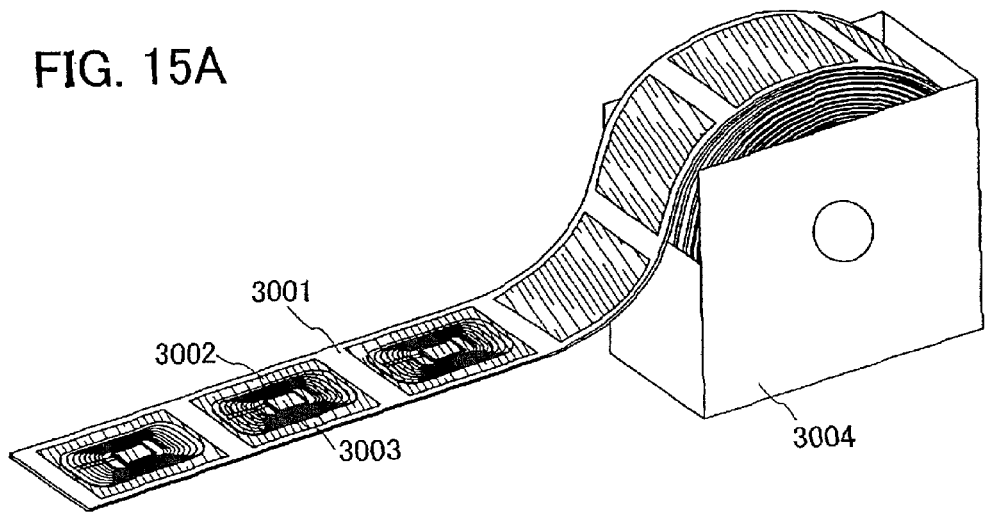
FIGS. 15A to 15E are diagrams each showing a usage mode of a semiconductor device of the present invention.

FIG. 15A illustrates an example of a state of completed products of wireless tags of the present invention. On a label board (separate paper) 3001, a plurality of ID labels 3003 each incorporating a wireless tag 3002 are formed. The ID labels 3003 are held in a box 3004. In addition, on each of the ID labels 3003, information on a product or service (a name of the product, a brand, a trademark, a trademark owner, a seller, a manufacturer, and the like) is written, while an ID number that is unique to the product (or the kind of the product) is assigned to the incorporated wireless tag to make it possible to easily figure out forgery, infringement of intellectual property rights such as a patent right and a trademark right, and illegality such as unfair competition. Moreover, a lot of information that cannot be fully written on a container of the product or the label, for example, the production area, selling area, quality, raw material, efficacy, use, quantity, shape, price, production method, usage, time of the production, time of the use, expiration date, instructions of the product, information on the intellectual property of the product, or the like can be inputted in the wireless tag so that traders and consumers can access the information using a simple reader. Although producers can easily rewrite or delete the information, traders and consumers are not allowed to rewrite or delete the information. Note that a structure may be employed in which the wireless tag is provided with a display portion so that such information can be displayed.

Figure 15B:
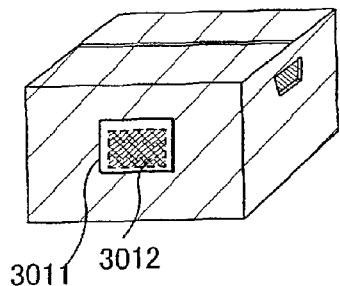

FIG. 15B illustrates a label-shaped wireless tag 3011 incorporating a wireless tag 3012. By being provided with the wireless tag 3011, the products can be managed easily. For example, in the case where the product is stolen, the pathway of the product can be traced, so that the criminal who stole the product can be figured out quickly. By thus being provided with the wireless tag, products that are superior in so-called traceability can be distributed.

Figure 15C:
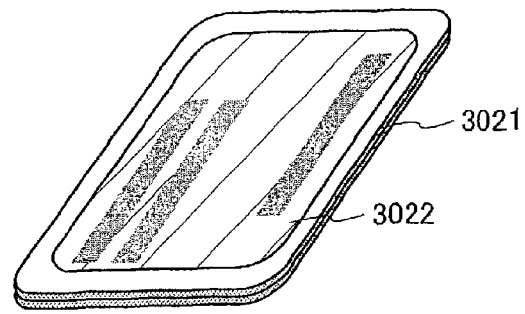

FIG. 15C illustrates an example of a state of a completed product of an ID card 3021 including a wireless tag 3022. The ID card 3021 includes all kinds of cards such as a cash card, a credit card, a prepaid card, an electronic ticket, electronic money, a telephone card, and a membership card. In addition, a structure may be employed in which the front side of the ID card 3021 is provided with a display portion to display a wide range of information.

Figure 15D:
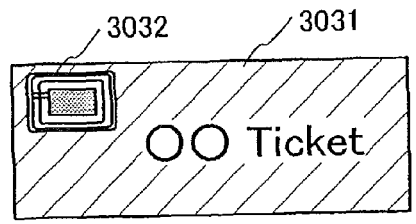

FIG. 15D illustrates an example of a state of a completed product of a bearer bond 3031. A wireless tag 3032 is embedded in the bearer bond 3031 and is protected by a resin formed in the periphery thereof. Here, the resin is filled with a filler. The bearer bond 3031 can be formed in the same manner as a wireless tag of the present invention. Note that the above bearer bond includes stamps, tickets, admission tickets, merchandise coupons, book coupons, stationery coupons, beer coupons, rice coupons, various gift coupons, various service coupons, and the like. Needless to say, the bearer bond is not limited thereto. In addition, when the wireless tag 3032 of the present invention is provided in bills, coins, securities, bearer bonds, documents, or the like, an authentication function can be provided; therefore, forgery can be prevented with the utilization of the authentication function.

Figure 15E:
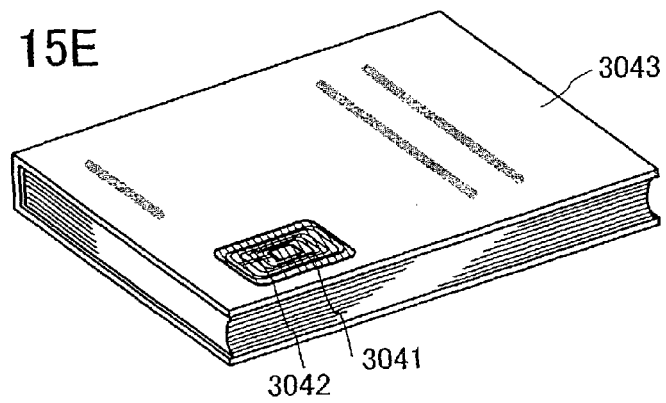

FIG. 15E illustrates a book 3043 to which an ID label 3041 including a wireless tag 3042 is attached. The wireless tag 3042 of the present invention is fixed on goods by, for example, being attached to a surface or embedded therein. As illustrated in FIG. 15E, the wireless tag 3042 can be embedded in paper of a book, or embedded in an organic resin of a package. Since the wireless tag 3042 of the present invention can realize a small size, a thin shape, and lightweight, the wireless tag can be fixed on goods without spoiling the design thereof.

In addition, although not illustrated here, the efficiency of a system such as an inspection system can be improved by provision of the wireless tag of the present invention in, for example, packaging containers, storage media, personal belongings, foods, clothing, everyday articles, electronic devices, or the like. In addition, counterfeits and theft can be prevented by provision of the wireless tag on vehicles. Individual creatures such as animals can be easily identified by being implanted with the wireless tag. For example, year of birth, sex, breed, or the like can be easily identified by implantation of the wireless tag in creatures such as domestic animals.

In this way, the wireless tag of the present invention can be used for various products. In particular, the wireless tag of the present invention has a wide communication range, and operates normally in severe environment at low temperature or high temperature; therefore, the wireless tag of the present invention is superior in reliability and usability and is effective.

This application is based on Japanese Patent Application serial No. 2006-323119 filed in Japan Patent Office on Nov. 30, 2006, the entire contents of which are hereby incorporated by reference.

What is claimed is:

1. A semiconductor device comprising:
   a phase locked loop comprising a loop filter, and configured to output a clock signal;
   a first antenna configured to receive a first electromagnetic wave and output a first alternating current signal;
   a second antenna configured to receive a second electromagnetic wave and output a second alternating current signal;
   a battery configured to be charged wirelessly by the first alternating current signal supplied from the first antenna and the second alternating current signal supplied from the second antenna, and output a power supply voltage to the phase locked loop; and
   a control circuit configured to control charging and discharging of the battery,
   wherein a characteristic of the phase locked loop is switched in accordance with a time constant of the loop filter,
   wherein the first antenna is connected to both the phase locked loop and the battery, and
   wherein the first antenna is configured to supply the first alternating current signal to a first demodulation circuit so that the phase locked loop outputs the clock signal, and to a first power supply circuit so that the battery is charged wirelessly.

2. The semiconductor device according to claim 1, further comprising a logic circuit configured to receive the clock signal.

3. The semiconductor device according to claim 1, wherein the phase locked loop further comprises a comparator circuit, and a voltage controlled oscillator circuit.

4. The semiconductor device according to claim 1, wherein the semiconductor device is configured to perform wireless communication.

5. The semiconductor device according to claim 1, further comprising a second power supply circuit configured to rectify the second alternating current signal supplied from the second antenna.

6. The semiconductor device according to claim 1, further comprising a second demodulation circuit configured to demodulate the second alternating current signal supplied from the second antenna,
   wherein the control circuit controls charging and discharging of the battery in accordance with a first potential supplied from the battery and a demodulated signal supplied from the second demodulation circuit.

7. The semiconductor device according to claim 1, further comprising a first modulation circuit connected to the first antenna, and a second modulation circuit connected to the second antenna.

8. The semiconductor device according to claim 1, wherein the second antenna is connected to the battery, and is not connected to the phase locked loop.

9. A semiconductor device comprising:
   a phase locked loop comprising a divider circuit, and configured to output a clock signal;
   a first antenna configured to receive a first electromagnetic wave and output a first alternating current signal;
   a second antenna configured to receive a second electromagnetic wave and output a second alternating current signal;
   a battery configured to be charged wirelessly by the first alternating current signal supplied from the first antenna and the second alternating current signal supplied from the second antenna, and output a power supply voltage to the phase locked loop; and
   a control circuit configured to control charging and discharging of the battery,
   wherein a characteristic of the phase locked loop is switched in accordance with a frequency division number of the divider circuit,
   wherein the first antenna is connected to both the phase locked loop and the battery, and
   wherein the first antenna is configured to supply the first alternating current signal to a first demodulation circuit so that the phase locked loop outputs the clock signal, and to a first power supply circuit so that the battery is charged wirelessly.

10. The semiconductor device according to claim 9, further comprising a logic circuit configured to receive the clock signal.

11. The semiconductor device according to claim 9, wherein the phase locked loop further comprises a comparator circuit, and a voltage controlled oscillator circuit.

12. The semiconductor device according to claim 9, wherein the semiconductor device is configured to perform wireless communication.

13. The semiconductor device according to claim 9, further comprising a second power supply circuit configured to rectify the second alternating current signal supplied from the second antenna.

14. The semiconductor device according to claim 9, further comprising a second demodulation circuit configured to demodulate the second alternating current signal supplied from the second antenna,
   wherein the control circuit controls charging and discharging of the battery in accordance with a first potential supplied from the battery and a demodulated signal supplied from the second demodulation circuit.

15. The semiconductor device according to claim 9, further comprising a first modulation circuit connected to the first antenna, and a second modulation circuit connected to the second antenna.

16. The semiconductor device according to claim 9, wherein the second antenna is connected to the battery, and is not connected to the phase locked loop.

* * * * *